United States Patent [19]
Ihara

[11] Patent Number: 5,517,446
[45] Date of Patent: May 14, 1996

[54] NONVOLATILE SEMICONDUCTOR MEMORY DEVICE AND METHOD FOR DRIVING THE SAME

[75] Inventor: Makoto Ihara, Sakurai, Japan

[73] Assignee: Sharp Kabushiki Kaisha, Osaka, Japan

[21] Appl. No.: 324,332

[22] Filed: Oct. 14, 1994

[30] Foreign Application Priority Data

Oct. 14, 1993 [JP] Japan .................................. 5-257266

[51] Int. Cl.$^6$ .................................................. G11C 11/22
[52] U.S. Cl. .......................... 365/145; 365/149; 365/203
[58] Field of Search ..................................... 365/145, 149, 365/203, 210, 202

[56] References Cited

U.S. PATENT DOCUMENTS

| | | | |
|---|---|---|---|
| 5,297,077 | 3/1994 | Imai et al. | 365/145 |
| 5,392,234 | 2/1995 | Hirano et al. | 365/145 |
| 5,406,510 | 4/1995 | Mihara et al. | 365/149 X |

FOREIGN PATENT DOCUMENTS

| | | |
|---|---|---|
| 4-42498 | 2/1992 | Japan . |
| 5-75072 | 3/1993 | Japan . |
| 6-243690 | 9/1994 | Japan . |

*Primary Examiner*—David C. Nelms
*Assistant Examiner*—Huan Hoang
*Attorney, Agent, or Firm*—Morrison & Foerster

[57] ABSTRACT

The nonvolatile semiconductor memory device of the invention includes: bit-line pairs; word lines; memory cells each including a capacitor having a ferroelectric film between electrodes thereof, and a switching element connected to one of the word lines, one of the electrodes of the capacitor being connected to one bit line of the bit-line pairs via the switching element, the other electrode of the capacitor being connected to a common cell plate; sense amplifiers each connected to one of the bit-line pairs; a row decoder for selecting one of the word lines corresponding to an input row address; and a column decoder for selecting at least one of the bit-line pairs corresponding to an input column address. The device further includes: a first driving circuit for precharging the bit lines to a first potential; and a second driving circuit for precharging again the bit-line pair selected by the column decoder to a second potential which is different from the first potential. In the memory device, a potential difference between the first potential and a potential of the common cell plate is smaller than a potential difference which causes polarization inversion in the ferroelectric film, and a potential difference between the second potential and the potential of the common cell plate is equal to or larger than the potential which causes potential inversion in the ferroelectric film.

10 Claims, 19 Drawing Sheets

NONVOLATILE SEMICONDUCTOR MEMORY DEVICE AND METHOD FOR DRIVING THE SAME

BACKGROUND OF THE INVENTION

1. Field of the Invention

The present invention relates to a nonvolatile semiconductor memory device and a method for driving the nonvolatile semiconductor memory device, and more particularly to a nonvolatile semiconductor memory device in which a memory cell for storing information has a capacitor insulating film of a ferroelectric material, and a method for driving the nonvolatile semiconductor memory device.

2. Description of the Related Art

In nonvolatile semiconductor memory devices using a ferroelectric film (e.g. PZT ($PbZrTiO_3$) or the like) for the capacitor insulating film of a memory cell, the hysteresis characteristics of polarization caused in the ferroelectric are utilized, and the information is stored by the remanent polarization of the ferroelectric film in a nonvolatile manner. In such nonvolatile semiconductor memory device, a memory cell for storing information of 1 bit usually includes two capacitors with ferroelectric films and two switching elements (transistors). In order to reduce the chip area and to increase the density of integrated circuits, a nonvolatile semiconductor memory device using a memory cell having one capacitor and one transistor (1C-1Tr memory cell) has been proposed (Japanese Laid-Open Patent Publication No. 5-75072).

FIG. 9 shows a part of the circuitry of a conventional nonvolatile semiconductor memory device 200 using the 1C-1Tr memory cell. As shown in FIG. 9, in the nonvolatile semiconductor memory device 200, a number of bit lines extending along the row direction are arranged in parallel in a column direction. A number of word lines $WL_0$–$WL_{n-1}$ extend perpendicular to the bit lines (i.e., along the column direction) and are arranged in parallel in the row direction. In the read operation, one of the word lines $WL_0$–$WL_{n-1}$ is selected in accordance with a row address, so as to be at a high potential level. In addition, two dummy word lines $DWL_0$ and $DWL_1$ are disposed in parallel to the word lines $WL_0$–$WL_{n-1}$. The dummy word line $DWL_0$ goes high when one of every other word lines (even-numbered word lines) $WL_0, WL_2, \ldots$ is selected. The dummy word line $DWL_1$ goes high when one of the remaining word lines (odd-numbered word lines) $WL_1, WL_3, \ldots$ is selected.

Adjacent two bit lines $BL_i$ and $\overline{BL_i}$ are paired (FIG. 9 shows the bit-line pairs of i=1, 2, 3, and 4).

To each pair of bit lines $BL_i$ and $\overline{BL_i}$, a sense amplifier 13, a bit-line equalizing circuit 11, a number of memory cells 6, and four dummy cells 7–10 are connected.

For each bit-line pair, respective memory cells 6 are disposed at crossings of one bit line $BL_i$ and the even-numbered word lines $WL_0, WL_2, \ldots$, and crossings of the other bit line $\overline{BL_i}$ and the odd-numbered word lines $WL_1, WL_3, \ldots$. Two dummy cells 7 and 8 are disposed correspondingly to the bit line $BL_i$ and the dummy word line $DWL_1$, and two dummy cells 9 and 10 are disposed correspondingly to the bit line $\overline{BL_i}$.

Next, the detailed circuitry of the nonvolatile semiconductor memory device 200 is described. FIG. 10 shows the circuitry of the sense amplifier 13 and the bit-line equalizing circuit 11. FIG. 10 shows pairs of bit lines $BL_i$ and $\overline{BL_i}$ of i=1, 2, 3, and 4.

The sense amplifier 13 differentially amplifies a small potential difference between bit lines $BL_i$ and $\overline{BL_i}$ by using four transistors $Q_{31}$–$Q_{34}$, so as to make the signal level valid. Among the four transistors, $Q_{31}$ and $Q_{32}$ are N-channel MOSFETs (Metal Oxide Semiconductor Field Effect Transistors), and $Q_{33}$ and $Q_{34}$ are P-channel MOSFETs. The transistors $Q_{31}$ and $Q_{32}$ are connected to a ground potential level GND via an N-channel MOSFET $Q_{35}$ of which the gate is connected to a sense-amplifier driving signal line S. The transistors $Q_{33}$ and $Q_{34}$ are connected to a $V_{CC}$ power supply via a P-channel MOSFET $W_{36}$ of which the gate is connected to a sense-amplifier driving signal line $\overline{S}$. The sense amplifier 13 performs its differential amplification only when the sense-amplifier driving signal lines S and $\overline{S}$ go high ($V_{CC}$ level) and low (GND level), respectively. As described later, in the read operation, after a small potential difference is read out from a memory cell 6 and the dummy cells 7–10 to the bit lines $BL_i$ and $\overline{BL_i}$, the sense-amplifier driving signal lines S and $\overline{S}$ go high and low, respectively by the operation of a control circuit (not shown).

The bit-line equalizing circuit 11 includes three P-channel MOSFETs $Q_{111}$–$Q_{113}$. The source of the transistor $Q_{111}$ is connected to the $V_{CC}$ power supply, and the drain thereof is connected to the bit line $BL_i$. The source of the transistor $Q_{112}$ is connected to the $V_{CC}$ power supply, and the drain thereof is connected to the bit line $\overline{BL_i}$. The drain of the transistor $Q_{113}$ is connected to the bit line $BL_i$, and the source thereof is connected to the other bit line $\overline{BL_i}$. The respective gates of the transistors $Q_{111}$–$Q_{113}$ are connected to a bit-line equalizing signal line $\overline{BEQ}$. The bit-line equalizing circuit 11 precharges the bit lines $BL_i$ and $\overline{BL_i}$ to the supply voltage $V_{CC}$ by the transistors $Q_{111}$ and $Q_{112}$, and equalizes the potentials of the bit lines $BL_i$ and $\overline{BL_i}$ by the transistor $Q_{113}$, when the bit-line equalizing signal line $\overline{BEQ}$ goes low (in the ON state). Then, the bit-line equalizing signal line $\overline{BEQ}$ goes temporarily low immediately before the read operation by the operation of the control circuit (not shown).

As shown in FIG. 11, each memory cell 6 includes a capacitor $C_S$ having a ferroelectric film between the electrodes and an N-channel MOSFET $Q_S$. One of the electrodes of the capacitor $C_S$ is connected to the bit line $BL_i$ or $\overline{BL_i}$ via the source-drain of the transistor $Q_S$. The other electrode of the capacitor $C_S$ is connected to a common cell plate to which a half voltage of the supply voltage $V_{CC}$ is supplied. The gate of the transistor $Q_S$ is connected to the corresponding one of the word lines $WL_0$–$WL_{n-1}$.

As shown in FIG. 12., each of the dummy cells 7–10 includes a dummy capacitor $C_D$ having a ferroelectric film between the electrodes and an N-channel MOSFET $Q_D$, similar to the memory cell 6. The dummy capacitor $C_D$ is formed so as to have a capacitance which is a half of that of the capacitor $C_S$ of the memory cell 6. One of the dummy capacitors $C_D$ is connected to one of the bit lines $BL_i$ and $\overline{BL_i}$ corresponding to the respective dummy cells 7–10, via the source-drain of the transistor $Q_D$. The other electrode of the dummy capacitor $C_D$ is connected to the common cell plate to which a half voltage of the supply voltage $V_{CC}$ is supplied. The gate of the transistor $Q_D$ is connected to one of the electrodes of the dummy word lines $DWL_0$ and $DWL_1$ corresponding to the dummy cells 7–10.

In each of the dummy cells 8 and 9, the connection node of one of the electrodes of the dummy capacitor $C_D$ and the source of the transistor $Q_D$ is grounded to the GND level via an N-channel MOSFET $Q_{DN}$. The gate of the transistor $Q_{DN}$ is connected to a common dummy-cell precharge line PDUM. In each of the dummy cells 8 and 9, when the dummy-cell precharge line PDUM goes high, the ground voltage GND (0 V) is applied to one of the electrodes of the dummy capacitor $C_D$.

In each of the dummy cells 7 and 10, the connection node of one of the electrodes of the dummy capacitor $C_D$ and the source of the transistor $Q_D$ is connected to the $V_{CC}$ power supply via a P-channel MOSFET $Q_{DP}$. The gate of the transistor $Q_{DP}$ is connected to a dummy-cell precharge line $\overline{PDUM}$. In each of the dummy cells 7 and 10, when the dummy-cell precharge line $\overline{PDUM}$ goes low, the supply voltage $V_{CC}$ is applied to one of the electrodes of the dummy capacitor $C_D$. The dummy-cell precharge lines PDUM and $\overline{PDUM}$ go high and low, respectively by the operation of the control circuit (not shown), at the same time when the bit-line equalizing signal line $\overline{BEQ}$ goes low.

Next, the write operation and the read operation for the memory cells in the nonvolatile semiconductor memory device 200 are described. In the following explanation, a word line WL indicates any one of the word lines $WL_0$–$WL_{n-1}$ selected in the write or read operation. A bit line BL indicates one of a pair of bit lines $BL_i$ and $\overline{BL}_i$ selected at that time, and corresponding to the memory cell 6 connected to the selected word line WL.

When data "1" is to be written into the memory cell 6, as shown in FIG. 13, the word line WL is set high, while a supply voltage $V_{CC}$ is applied to the bit line BL. Accordingly, the transistor $Q_S$ is turned ON, and the supply voltage $V_{CC}$ of the bit line BL is applied to one of the electrodes of the capacitor $C_S$. Since a half voltage of the supply voltage $V_{CC}$ is applied to the other electrode of the capacitor $C_S$, a half voltage of the supply voltage $V_{CC}$ is applied across the electrodes of the capacitor $C_S$ (hereinafter, the polarity of the voltage in this state is assumed to be positive). To the ferroelectric film between the electrodes of the capacitor $C_S$, a positive electric field $E_{max}$ corresponding to a positive half voltage of the supply voltage $V_{CC}$ is applied. Polarization charge $P_s$ is accumulated in the capacitor $C_S$ (FIG. 14).

Thereafter, the word line WL returns to a low level, and the transistor $Q_S$ is turned OFF. Then, due to a leakage current of the ferroelectric film in the capacitor, the electric potential levels of the two electrodes of the capacitor $C_S$ gradually become equal to each other. At this time, no electric field is applied to the ferroelectric film, but the ferroelectric film holds the remanent polarization charge $P_r$. The remanent polarization charge $P_r$ can be held even when the supply of supply voltage to the nonvolatile semiconductor memory device is cut off and ½ $V_{CC}$ is not applied to the other end of the capacitor $C_S$. Therefore, the memory cell 6 stores the data "1" as nonvolatile information by the remanent polarization charge $P_r$.

When data "0" is to be written into the memory cell 6, as shown in FIG. 15, the word line WL is set high, while a ground voltage GND (0 V) is applied to the bit line BL. Accordingly, the transistor $Q_S$ is turned ON, and 0 V is applied to one of the electrodes of the capacitor $C_S$. A half voltage of the supply voltage $V_{CC}$ of the polarity opposite to that of the above-mentioned case is applied across the electrodes of the capacitor $C_S$ (hereinafter, the polarity of the voltage is assumed to be negative). To the ferroelectric film between the electrodes of the capacitor $C_S$, a negative electric field $-E_{max}$ corresponding to a negative half voltage of the supply voltage $V_{CC}$ is applied. Polarization charge $-P_s$ is accumulated in the capacitor $C_S$ (FIG. 16).

Thereafter, the word line WL returns to a low level, and the transistor $Q_S$ is turned OFF. Then, due to a leakage current of the ferroelectric film in the capacitor, the electric potential levels of the two electrodes of the capacitor $C_S$ gradually become equal to each other. At this time, no electric field is applied to the ferroelectric film, but the ferroelectric film holds remanent polarization charge $-P_r$. The remanent polarization charge $-P_r$ can be held even when the supply of supply voltage is cut off and ½ $V_{CC}$ is not applied to the other end of the capacitor $C_S$. Therefore, the memory cell 6 stores the data "0" as nonvolatile information by the remanent polarization charge $-P_r$.

When the data stored in the memory cell 6 is to be read, the bit line BL is precharged to the supply voltage $V_{CC}$ prior to the read operation. After the supply voltage is applied and charge is sufficiently accumulated, the bit line is disconnected from the power supply, so as to complete the precharge.

The read operation when the data "1" is stored in the memory cell 6 is shown in FIG. 17. The word line WL is set high in the precharged state, and then the transistor $Q_S$ is turned ON. Accordingly, the charge of the bit line BL and the remanent polarization charge $P_r$ held in the ferroelectric film of the capacitor $C_S$ are charge-shared. In general, the capacitance $C_B$ of the bit line BL is sufficiently larger than the capacitance $C_S$ of the capacitor $C_S$, so that a voltage substantially equal to the supply voltage $V_{CC}$ is applied to one of the electrodes of the capacitor $C_S$. Therefore, a positive voltage substantially equal to a half of the supply voltage $V_{CC}$ is applied across the electrodes of the capacitor $C_S$, so that, as shown in FIG. 18, an electric field $E_{max}$ corresponding to the positive voltage is applied to the ferroelectric film. Thus, polarization charge $P_s$ is accumulated in the ferroelectric film. As is seen from FIG. 18, polarization reversal is not caused in the ferroelectric film. The amount of charge moved from the bit line BL to the capacitor $C_S$ is $P_s$–$P_r$.

Accordingly, the potential variation $\Delta V_1$ of the bit line BL, i.e., the read voltage level of the bit line L in the case where the data "1" is read out is given by Equation (1) below.

$$\Delta V_1 = -\frac{P_s - P_r}{C_B} \qquad (1)$$

The read operation when the data "0" is stored in the memory cell 6 is shown in FIG. 19. The word line WL is set high in the state precharged to the supply voltage $V_{CC}$, and then the transistor $Q_S$ is turned ON. Accordingly, the charge of the bit line BL and the remanent polarization charge $-P_r$ held in the ferroelectric film of the capacitor $C_S$ are charge-shared. In general, the capacitance $C_B$ of the bit line BL is sufficiently larger than the capacitance $C_S$ of the capacitor $C_S$, so that a voltage substantially equal to the supply voltage $V_{CC}$ is applied to one of the electrodes of the capacitor $C_S$. Therefore, a positive voltage substantially equal to a half of the supply voltage $V_{CC}$ is applied across the electrodes of the capacitor $C_S$, so that, as shown in FIG. 20, an electric field $E_{max}$ corresponding to the positive voltage is applied to the ferroelectric film. Thus, polarization charge $P_s$ is accumulated in the ferroelectric film. As is seen from FIG. 20, the polarization reversal is caused in the ferroelectric film. The amount of charge moved from the bit line BL to the capacitor $C_S$ is $P_s$+$P_r$.

Accordingly, the potential variation $\Delta V_0$ of the bit line BL, i.e., the read voltage level of the bit line L in the case where the data "0" is read out is given by Equation (2) below.

$$\Delta V_0 = -\frac{P_s + P_r}{C_B} \quad (2)$$

As described above, in the read operation, the read voltage level (the potential variation of the bit line BL) is different depending on the data stored in the memory cell 6. By detecting and amplifying the difference, it is possible to identify the stored data. In the nonvolatile semiconductor memory device 200, as described below, the read voltage level (potential variation) of one of a pair of bit lines $BL_i$ and $\overline{BL}_i$ is compared with the potential variation of the other bit line by the dummy cells 7–10, so that the stored data is detected.

Next, by referring to FIG. 21, the specific procedure of the read operation in the nonvolatile semiconductor memory device 200 will be described.

First, prior to the read operation, at time $t_{21}$, a low-pulse is input to the bit-line equalizing signal line $\overline{BEQ}$ (i.e., the line is kept at a low level for a predetermined time period), so that the bit-line equalizing circuit 11 is driven. That is, the P-channel transistors $Q_{111}$–$Q_{113}$ are turned ON, and the bit lines $BL_i$ and $\overline{BL}_i$ are precharged to the supply voltage $V_{CC}$. In a synchronizing manner, at the time $t_{21}$, a high-pulse is input into the dummy-cell precharge line PDUM (i.e., the line is kept at a high level for a predetermined time period), so that a ground voltage GND (0 V) is applied to one of the electrodes of the dummy capacitor $C_D$ in each of the dummy cells 8 and 9. Similarly, a low-pulse is input into the dummy-cell precharge line $\overline{PDUM}$, so that the supply voltage $V_{CC}$ is applied to one of the electrodes of the dummy capacitor $C_D$ in each of the dummy cells 7 and 10.

When 0 V is applied to one of the electrodes of the dummy capacitor $C_D$, a negative half voltage of the supply voltage $V_{CC}$ is applied across the electrodes of the dummy capacitor $C_D$. Accordingly, similarly to the case where the data "0" is written into the memory cell 6, the ferroelectric film is polarized in a negative direction. When the supply voltage $V_{CC}$ is supplied to one of the electrodes of the dummy capacitor $C_D$, a positive half voltage of the supply voltage $V_{CC}$ is applied across the electrodes of the dummy capacitor $C_D$. Accordingly, similar to the case where the data "1" is written into the memory cell 6, the ferroelectric film is polarized in a positive direction. Therefore, the ferroelectric films of the dummy capacitors $C_D$ in the two dummy cells (7 and 8, or 9 and 10) connected to one bit line ($BL_i$ or $\overline{BL}_i$) are polarized in directions opposite to each other. Since the capacitance of the capacitor $C_D$ in each of the dummy cells 7–10 is half of the capacitance of the capacitor $C_S$ in the memory cell 6, in the case where an identical voltage is applied, the charge held in the dummy capacitor $C_D$ is a half of the charge held in the capacitor $C_S$.

Next, at time $t_{22}$ at which the read operation starts, any one word line WL of the word lines $WL_0$–$WL_{n-1}$ is selected to be set high and the transistor $Q_S$ of the memory cell 6 connected to the word line WL is turned ON. When data "1" is stored in the memory cell 6, as described above, the charge corresponding to ($P_s$–$P_r$) moves from the bit line BL to the capacitor $C_S$. As a result, the potential level of the bit line BL is lowered from the supply voltage $V_{CC}$ by the potential variation $\Delta V_1$ expressed by Equation (1). When data "0" is stored in the memory cell 6, as described above the charge corresponding to ($P_s$+$P_r$) moves, so that the potential level of the bit line BL which is connected to the memory cell 6 is lowered from the supply voltage $V_{CC}$ by the potential variation $\Delta V_0$ expressed by Equation (2). As is apparent from FIGS. 18 and 20, the potential variation $\Delta V_1$ is relatively small and the potential variation $\Delta V_0$ is significantly large.

At time $t_{22}$, any one dummy word line DWL corresponding to the selected word line WL is also set high. That is, when the memory cell 6 connected to the selected word line WL is connected to one bit line $BL_i$, the dummy word line $DWL_0$ of the dummy cells 9 and 10 connected to the other bit line $\overline{BL}_i$ is set high. When the memory cell 6 is connected to the other bit line $\overline{BL}_i$, the dummy word line $DWL_1$ of the dummy cells 7 and 8 connected to the bit line $BL_i$ is set high.

In the above-described manner, when one dummy word line DWL goes high, transistors $Q_D$ in either pair of dummy cells 7 and 8 or dummy cells 9 and 10 are turned on. As to the dummy cells 7 and 10, the charge movement which is identical with the case where the data "1" is stored in the memory cell 6 occurs. As to the dummy cells 8 and 9, the charge movement which is identical with the case where the data "0" is stored in the memory cell 6 occurs. However, the capacitance of the dummy capacitor $C_D$ is set to be a half of the capacitance of the capacitor $C_S$ of the memory cell 6, so that the amount of charge moving from the bit line BL to the dummy capacitor $C_D$ of the dummy cell 7 or 10 is ($P_s$–$P_r$)/2 and the amount of charge moving from the bit line BL to the dummy capacitor $C_D$ of the dummy cell 8 or 9 is ($P_s$+$P_r$)/2. Accordingly, the total amount of charge moving from the bit line BL to the pair of dummy cells 7 and 8 or 9 and 10 is $P_s$ in any case. Thus, the potential variation $\Delta V_D$ of the bit line BL by a pair of dummy cells is constant as expressed by Equation (3) below.

$$\Delta V_D = -\frac{P_s}{C_B} \quad (3)$$

The potential variation is indicated by two-dot chain line in FIG. 21.

Therefore, in the case where the data "1" is stored in the memory cell 6, at the time after a short time elapses from time $t_{22}$, there occurs a potential difference $\Delta V_{dif1}$ expressed by Equation (4) below between the pair of bit lines $BL_i$ and $\overline{BL}_i$ as a difference between Equation (1) and Equation (3). The potential difference $\Delta V_{dif1}$ is input into and amplified by the sense amplifier 13 (which is described later).

$$\Delta V_{dif1} = -\frac{P_s - P_r}{C_B} - \left(-\frac{P_s}{C_B}\right) \quad (4)$$
$$= \frac{P_r}{C_B}$$

In the case where the data "0" is stored in the memory cell 6, there occurs a potential difference $\Delta V_{dif0}$ expressed by Equation (5) below as a difference between Equation (2) and Equation (3). The potential difference $\Delta V_{dif0}$ is input into and amplified by the sense amplifier 13 (which is described later).

$$\Delta V_{dif0} = -\frac{P_s + P_r}{C_B} - \left(-\frac{P_s}{C_B}\right) \quad (5)$$
$$= -\frac{P_r}{C_B}$$

As described above, between the pair of bit lines $BL_i$ and $\overline{BL}_i$ either one of potential differences having opposite polarities and the same absolute values occurs depending on the data stored in the memory cell 6 is "1" or "0". By amplifying the potential difference to a predetermined level by the sense amplifier 13 in the following manner, the data "1" and "0" can be identified.

At time $t_{23}$, the sense-amplifier driving signal lines S and $\overline{S}$ go high and low, respectively. As a result, the sense amplifier 13 is driven so as to differentially amplify the potential difference. Then, the potential levels of the pair of bit lines $BL_i$ and $\overline{BL}_i$ are changed to the supply voltage $_{CC}$ and the ground voltage GND, respectively, based on the polarity of the potential difference, so as to make the signal level valid. By reading the signal levels of the pair of bit lines $BL_i$ and $\overline{BL}_i$, the data stored in the selected memory cell 6 can be identified and output. That is, the digital value which is stored in a nonvolatile manner can be read out without fail.

As shown in FIG. 21, the high-level voltage applied to the word line WL and the dummy word line DWL is set higher than the supply voltage $V_{CC}$ by a threshold voltage $V_{th}$ of the transistor $Q_S$ and the transistor $Q_D$. This setting makes it sure to apply a supply voltage $V_{CC}$ of the bit line BL to one of the electrodes of each of the capacitor $C_S$ and the dummy capacitor $C_D$.

Next, the construction of a conventional nonvolatile semiconductor memory device for storing 1-bit information to a memory cell having two capacitors and two transistors (2C-2Tr) is described. The construction of such a 2C-2Tr memory cell 12 is shown in FIG. 22.

The memory cell 12 includes two N-channel MOSFETs $Q_{S1}$ and $Q_{S2}$ and two capacitors $C_{S1}$ and $C_{S2}$ each having a ferroelectric film between the electrodes. One of the electrodes of the capacitor $C_{S1}$ is connected to one bit line $BL_i$ via the source and drain of the transistor $Q_{S1}$. One of the electrodes of the capacitor $C_{S2}$ is connected to the other bit line $\overline{BL}_i$ via the source and drain of the transistor $Q_{S2}$. The other electrodes of the capacitors $C_{S1}$ and $C_{S2}$ are both connected to a drive line DL. The gates of the transistors $Q_{S1}$ and $Q_{S2}$ are both connected to the corresponding word line WL.

The operation for writing data "1" into the memory cell 12 is performed in the following manner. First, a supply voltage $V_{CC}$ is applied to one bit line $BL_i$, and a ground voltage GND is applied to the other bit line $\overline{BL}_i$. After the word line WL is set high, and hence the transistors $Q_{S1}$ and $Q_{S2}$ are turned ON, a pulse voltage is applied to the drive line DL. The pulse signal changes from the ground voltage GND to the supply voltage $V_{CC}$ and then back to the ground voltage GND. Due to the pulse signal, an electric field $E_{VCC}$ corresponding to the supply voltage $V_{CC}$ is applied across the electrodes of the capacitor $C_{S1}$, when the drive line DL is at the ground voltage GND. A negative electric field $-E_{VCC}$ corresponding to a negative supply voltage $-V_{CC}$ is applied across the electrodes of the capacitor $C_{S2}$, when the drive line DL is at the supply voltage $V_{CC}$. As a result, the ferroelectric films of the capacitors $C_{S1}$ and $C_{S2}$ are polarized to $P_s$ and $-P_s$, respectively. After the level of the drive voltage returns to the ground voltage GND and the transistors $Q_{S1}$ and $Q_{S2}$ are turned OFF, the remanent polarization charges $P_r$ and $-P_r$ are held (FIG. 23).

When the data "0" is to be written, similarly, the supply voltage $V_{CC}$ is applied to the bit line $BL_i$, and the ground voltage GND is applied to the other bit line $\overline{BL}_i$. As a result, the ferroelectric films of the capacitors $C_{S1}$ and $C_{S2}$ hold the remanent polarization charges $-P_r$ and $P_r$ of the polarities opposite to those in the case of the writing of the data "1". As described above, the ferroelectric films of the two capacitors $C_{S1}$ and $C_{S2}$ hold remanent polarization charges of polarities opposite to each other, so that the 1-bit information is stored in the nonvolatile manner.

The data stored in the memory cell 12 is read out in the following manner. First, the bit lines $BL_i$ and $\overline{BL}_i$ are precharged to the ground voltage GND. That is, the bit lines $BL_i$ and $\overline{BL}_i$ are connected to the ground voltage GND so as to sufficiently release the charge, and then disconnected, i.e., the discharge is performed. The word line WL is set high in the discharged state, and then the transistor $Q_S$ is turned ON. A stepped voltage which changes from the ground voltage GND to the supply voltage $V_{CC}$ is applied to the drive line DL. When the potential level of the drive line DL reaches the supply voltage $V_{CC}$, a negative electric field $-E_{VCC}$ corresponding to the supply voltage $V_{CC}$ of the opposite polarity is applied between the electrodes of the two capacitors $C_{S1}$ and $C_{S2}$. Thus, the ferroelectric films of the capacitors $C_{S1}$ and $C_{S2}$ are polarized to $P_s$ and $-P_s$, respectively.

When the data "1" is stored in the memory cell 12, as shown in FIG. 24, the charge of the bit line $BL_i$ and the remanent polarization charge $P_r$ held in the ferroelectric film of the capacitor $C_{S1}$ are charge-shared and the charge of the bit line $\overline{BL}_i$ and the remanent polarization charge $-P_r$ held in the ferroelectric film of the capacitor $C_{S2}$ are charge-shared. At this time, as seen from FIG. 24, the polarization reversal does not occur in the ferroelectric film of the capacitor $C_{S2}$. Thus, a difference expressed as $P_s+P_r-(P_s-P_r)=2P_r$ occurs between the amounts of charges from the capacitors $C_{S1}$ and $C_{S2}$ to the bit lines $BL_i$ and $\overline{BL}_i$, respectively. Accordingly, a minute potential difference appears between the bit lines $BL_i$ and $\overline{BL}_i$. This potential difference is amplified by a sense amplifier 13, so that the data stored in the memory cell 12 is read out.

In the case where the data "0" is stored in the memory cell 12, the polarization reversal does not occur in the ferroelectric film of the capacitor $C_{S1}$, but occurs in the ferroelectric film of the capacitor $C_{S2}$. Between the bit lines $BL_i$ and $\overline{BL}_i$, there appears a minute potential difference of the polarity which is opposite to that of the case where the data "1" is stored. The potential difference is amplified by the sense amplifier 13, so that the data stored in the memory cell 12 is read out.

As described above, in the conventional nonvolatile semiconductor memory device 200, the data read from the memory cell 6 is a so-called "destructive read". That is, in the read of data, the electric field $E_{max}$ is applied to the ferroelectric film of the capacitor $C_S$. Therefore the polarization charge $P_s$ is accumulated in the capacitor $C_S$, so that the held remanent polarization charge $P_r$ or $-P_r$ corresponding to the data "1" or "0" is lost (see FIGS. 18 and 20).

In the nonvolatile semiconductor memory device using the above-described 2C-2Tr memory cell, similarly, the destructive read is performed. That is, a negative electric field $-E_{VCC}$ is uniformly applied to the ferroelectric films of both the capacitors $C_{S1}$ and $C_{S2}$ during the read operation, so that the remanent polarization charge $P_r$ or $-P_r$ of different polarities corresponding to the data "1" or "0" is lost (FIG. 24).

Therefore, after the read operation, it is necessary to perform a rewrite operation for writing the read-out data into the memory cell again by utilizing the valid signal levels of the bit lines $BL_i$ and $\overline{BL}_i$.

In general, a semiconductor memory device includes a row decoder for selecting a word line having a specific row address and a column decoder for selecting a bit-line pair having a specific column address. A memory cell which is disposed at the crossing of the selected word line and the bit-line pair is specified (i.e., the row address and the column address are specified), and the write and read operations are performed for the specified memory cell.

In the conventional nonvolatile semiconductor memory cell 200, when any one word line WL is selected and set high, the data of all memory cells 6 connected to the selected word line WL are destructively read out onto the respective bit lines BL and $\overline{BL}_i$. In other words, the data is destroyed as the result of the data read for the memory cells of which the data are not required. Accordingly, in order to hold the stored data, it is necessary to perform the rewrite of the data read out on the bit lines for all of the memory cells connected to the selected word lines WL. In order to perform the rewriting, it is necessary to drive the sense amplifiers 13 connected to all of the bit lines BL $\overline{BL}$. This results in waste power consumption because the amplification and rewrite are performed for the bit-line pairs for which the data read are not required. Thus, the consumed power is disadvantageously increased. This problem is also caused in the nonvolatile semiconductor memory cell having 2C-2Tr memory cells.

SUMMARY OF THE INVENTION

The nonvolatile semiconductor memory device of this invention includes; a plurality of bit-line pairs; a plurality of word lines; a plurality of memory cells each including a capacitor having a ferroelectric film between electrodes thereof and a switching element connected to one of the word lines, one of the electrodes of the capacitor being connected to one bit line of the bit-line pairs via the switching element, the other electrode of the capacitor being connected to a common cell plate; a plurality of sense amplifiers each connected to one of the bit-line pairs; a row decoder for selecting one of the word lines corresponding to an input row address; and a column decoder for selecting at least one of the bit-line pairs corresponding to an input column address. The device further includes: first driving means for precharging the plurality of bit lines to a first potential; and second driving means for precharging again the bit-line pair selected by the column decoder to a second potential which is different from the first potential, wherein a potential difference between the first potential and a potential of the common cell plate is smaller than a potential difference which causes polarization reversal in the ferroelectric film, and a potential difference between the second potential and the potential of the common cell plate is equal to or larger than the potential which causes potential inversion in the ferroelectric film.

In one embodiment of the invention, the nonvolatile semiconductor memory device further includes selection means for selecting among the sense amplifiers, sense amplifiers connected to the bit-line pair selected by the column decoder, and for activating the selected sense amplifiers.

In one embodiment of the invention, the first potential is substantially equal to the potential of the common cell plate.

In another embodiment of the invention, the second potential is a supply voltage, and the first potential is a half of the supply voltage.

According to another aspect of the invention, a method for driving a nonvolatile semiconductor memory device is provided. The method includes: a plurality of bit-line pairs; a plurality of word lines; and a plurality of memory cells for storing data, each including a capacitor having a ferroelectric film between electrodes thereof and a switching element connected to one of the word lines, one of the electrodes of the capacitor being connected to one bit line of the bit-line pairs via the switching element, the other electrode of the capacitor being connected to a common cell plate, the method comprising the steps of: precharging the plurality of bit-line pairs to a first potential; selecting at least one of the bit-line pairs corresponding to an input column address; precharging again the selected bit-line pair to a second potential which is different from the first potential; selecting one of the word lines corresponding to an input row address; reading out data stored in memory cells connected to the selected bit lines among the memory cells connected to the selected word lines, onto the selected bit lines; and amplifying the data read out onto the bit lines, so as to make the data valid, wherein a potential difference between the first potential and a potential of the common cell plate is smaller than a potential difference which causes polarization reversal in the ferroelectric film, whereby data stored in memory cells connected to non-selected bit lines are retained without being destroyed.

In one embodiment of the invention, a potential difference between the second potential and the potential of the common cell plate is equal to or larger than the potential which causes potential inversion in the ferroelectric film.

In another embodiment of the invention, the step of amplifying and validating the data is selectively performed for the selected bit-line pair.

In another embodiment of the invention, the first potential is substantially equal to the potential of the common cell plate.

In another embodiment of the invention, the second potential is a supply voltage and the first potential is half of the supply voltage.

Thus, the invention described herein makes possible the advantages of (1) providing a nonvolatile semiconductor memory device in which data of only a selected memory cell is read out without destroying the data of memory cells other than the selected memory cell, so that the power consumption is reduced, and (2) providing a method for driving the nonvolatile semiconductor memory device.

These and other advantages of the present invention will become apparent to those skilled in the art upon reading and understanding the following detailed description with reference to the accompanying figures.

DESCRIPTION OF THE PREFERRED EMBODIMENTS

Figure 1:
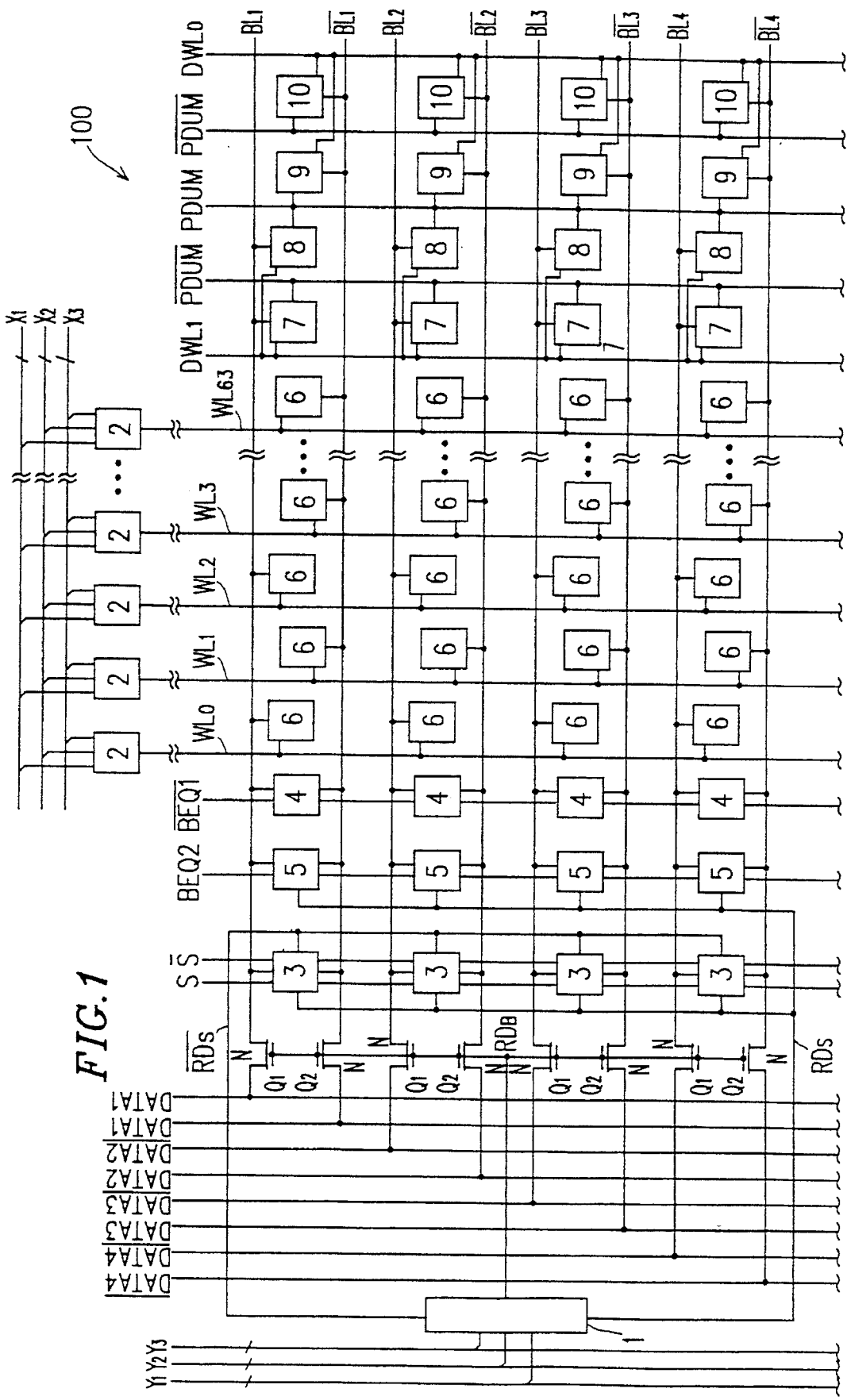
FIG. 1 is a block diagram showing a part of the circuitry of a nonvolatile semiconductor memory device in one embodiment of the invention.

First, the construction and the operation principle of a nonvolatile semiconductor memory device according to the invention are described below. In the nonvolatile semiconductor memory device of the invention, positive or negative remanent polarization is held in the ferroelectric film of the capacitor in each memory cell, so that information (data) is stored in a nonvolatile manner. In general, a memory cell is disposed at each of the intersections of a plurality of bit lines and a plurality of word lines, and the memory cells are arranged in a matrix. However, the memory cells are not necessarily provided at all of the intersections of the bit lines and the word lines. The nonvolatile semiconductor memory device includes a plurality of memory blocks each including bit lines, word lines, and memory cells which are arranged as described above. In this specification, one of such memory blocks is described.

In the read operation, a pair of bit lines and a word line are selected. By decoding a received address signal by a column decoder, a pair of bit lines are selected. By decoding a received address signal by a row decoder, a word line is selected. When a line is selected, the signal level of the line becomes active level.

First, prior to the read operation, all bit lines are precharged to a potential equal to the potential of a common cell plate (e.g., $\frac{1}{2} V_{CC}$) by a first precharge circuit. Then, bit lines selected by the column decoder are selectively precharged to a potential (e.g., $V_{CC}$) different from the potential of the common cell plate by a second precharge circuit. The other non-selected bit lines are kept at the potential of the common cell plate.

In this condition, by setting the selected word line WL at a high level, transistors of all the memory cells connected to the selected word line WL are turned ON. Among the memory cells, the nonvolatile information stored in memory cells connected to the bit-line pair selected by the column decoder is destructively read out. On the other hand, the nonvolatile information stored in memory cells connected bit lines which are not selected by the column decoder is not destroyed but held safely.

Next, referring to the drawings, one embodiment of the invention will be described. In the following description, identical component is designated by identical reference numerals to those used in the conventional nonvolatile semiconductor memory device 200.

FIG. 1 shows a part of the circuitry of a nonvolatile semiconductor memory device 100 of this example. As shown in FIG. 1, in the nonvolatile semiconductor memory device 100, n pairs of bit lines $BL_1, \overline{BL}_1, BL_2, \overline{BL}_2, \ldots$, and $BL_n, \overline{BL}_n$ each extending along the row direction are arranged in the column direction. In the nonvolatile semiconductor memory device 100, n word lines $WL_0$–$WL_{n-1}$ each extending along a direction perpendicular to the bit lines (i.e., along the column direction) are arranged in the row direction. In the read operation, one of the word lines $WL_0$–$WL_{n-1}$ is selected based on the row address and set to be at a high level. FIG. 1 shows the case of n=64.

In parallel to the word lines $WL_0$–$WL_{n-1}$, dummy word lines $DWL_0$ and $DWL_1$ and dummy-cell precharge lines PDUM and $\overline{PDUM}$ are disposed. The dummy word line $DWL_0$ goes high when one of every other word lines $WL_0$, $WL_2, \ldots$ (i.e., even-numbered word lines) is selected. The dummy word line $DWL_1$ goes high when one of the remaining odd-numbered word lines $WL_1, WL_3, \ldots$ is selected. The dummy-cell precharge lines PDUM and $\overline{PDUM}$ go high and low, respectively, by the operation of the control circuit (not shown) at the same time when the first precharge signal line $\overline{BEQ}_1$ (described below) goes low.

Adjacent two bit lines $BL_i$ and $\overline{BL}_i$ are paired (FIG. 1 shows the bit-line pairs of i=1, 2, 3, and 4). To each pair of bit lines $BL_i$ and $\overline{BL}_i$, a sense amplifier 3, a first bit-line precharge circuit 4, a second bit-line precharge circuit 5, 64 memory cells 6, and four dummy cells 7–10 are connected.

For each bit-line pair, respective memory cells 6 are disposed at crossings of one bit line $BL_i$ and the even-numbered word lines $WL_0, WL_2, \ldots$, and crossings of the other bit line $\overline{BL}_i$ and the odd-numbered word lines $WL_1$, $WL_3, \ldots$. Two dummy cells 7 and 8 are disposed correspondingly to the bit line $BL_i$ and the dummy word line $DWL_1$, and two dummy cells 9 and 10 are disposed correspondingly to the bit line $\overline{BL}_i$ and the dummy word line $DWL_0$.

One column decoder 1 is disposed for four pairs of bit lines $BL_i$ and $\overline{BL}_i$. In this example one column decoder 1 is connected to the four pairs of bit lines. However, the connection is not limited to this specific case. For example, one column decoder 1 can be provided for one pair of bit lines. A row decoder 2 is provided for each word line.

The nonvolatile semiconductor memory device 100 includes three row-address predecode lines $X_1$–$X_3$. A row-address predecode signal which is externally input is applied to the row decoders 2. Each of the row-address predecode lines $X_1$–$X_3$ includes four row-address lines, and one of the four row-address lines is selected in accordance with the applied predecode signal, so as to go high. The selection of one of four row-address lines in each row-address predecode line is performed for three row-address predecode lines, so that $4^3$=64 row-addresses can be specified. Three row-address lines respectively selected from the three row-address predecode lines $X_1$–$X_3$ are connected to each row decoder 2. The row decoder 2 make the connected word line active when all of the three row-address lines go high.

The nonvolatile semiconductor memory device 100 includes three column-address predecode lines $Y_1$–$Y_3$. A column-address predecode signal which is externally input is applied to the column decoder 1. As shown in FIG. 2B, each of the column-address predecode lines $Y_1$–$Y_3$ includes four column-address lines, and one of the four column-address lines is selected in accordance with the applied predecode signal, so as to go high. Three column-address lines respectively selected from the three column-address predecode lines are connected to a NAND circuit 1a (described below) of the column decoder 1. The selection of one of four column-address lines in each column-address predecode line is performed for three column-address predecode lines, so that $4^3$=64 column addresses can be specified. By specifying a one column address, one column decoder is selected. In this example, four pairs of bit lines are connected to one column decoder 1, so that four pairs of bit lines are selected by specifying one column address.

Next, the circuit configuration of the nonvolatile semiconductor memory device 100 is described in more detail.

Figure 11:
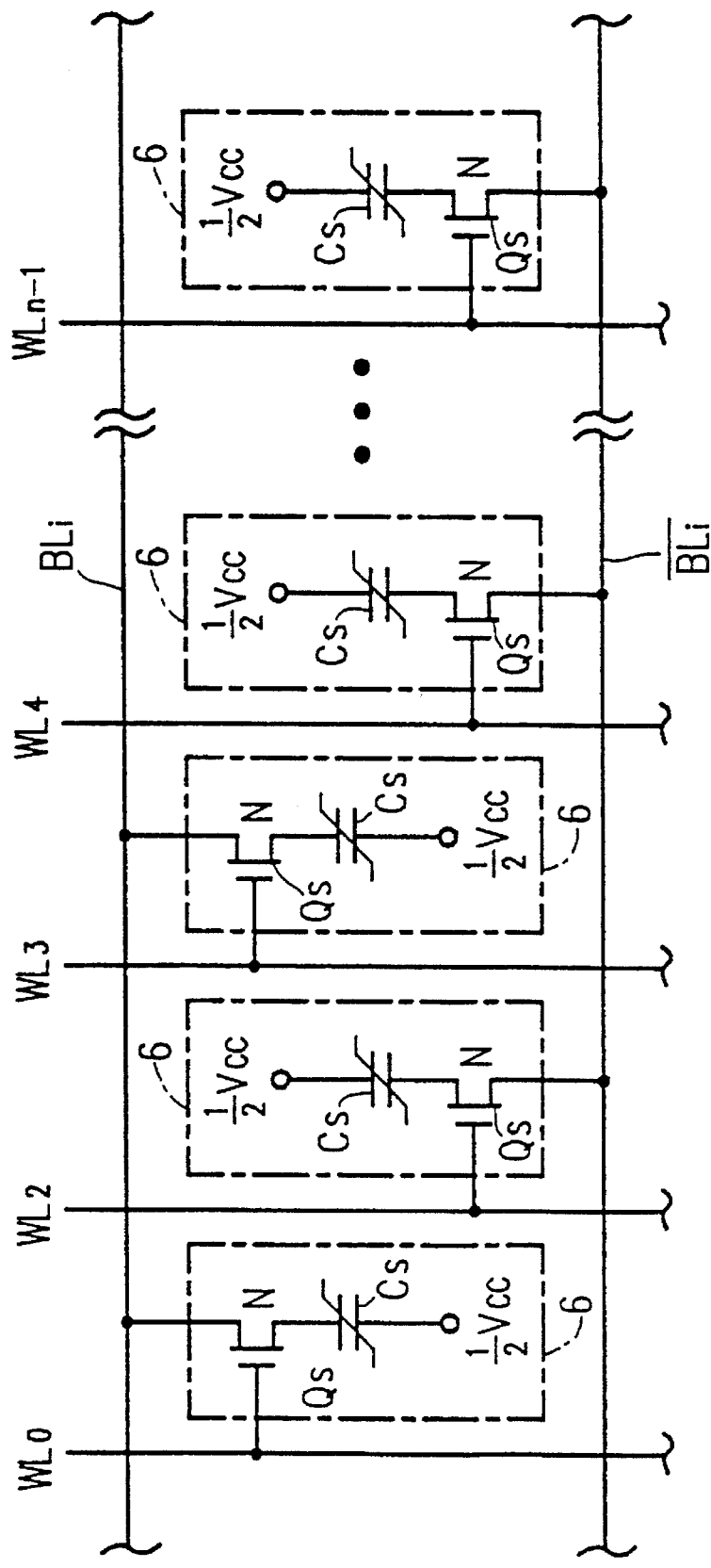
FIG. 11 is a diagram showing the specific circuitry of a memory cell.

The construction of the memory cell 6 and the dummy cells 7–10 is identical with that of conventional ones. As shown in FIG. 11, each memory cell 6 includes a capacitor $C_S$ having a ferroelectric film between the electrodes and an N-channel MOSFET $Q_S$. One of the electrodes of the capacitor $C_S$ is connected to the bit line $BL_i$ or $\overline{BL}_i$ via the source-drain of the transistor $Q_S$. The other electrode of the capacitor $C_S$ is connected to a common cell plate to which a half voltage of the supply voltage $V_{CC}$ is supplied. The gate of the transistor $Q_S$ is connected to the corresponding one of the word lines $WL_0$–$WL_{n-1}$.

Figure 12:
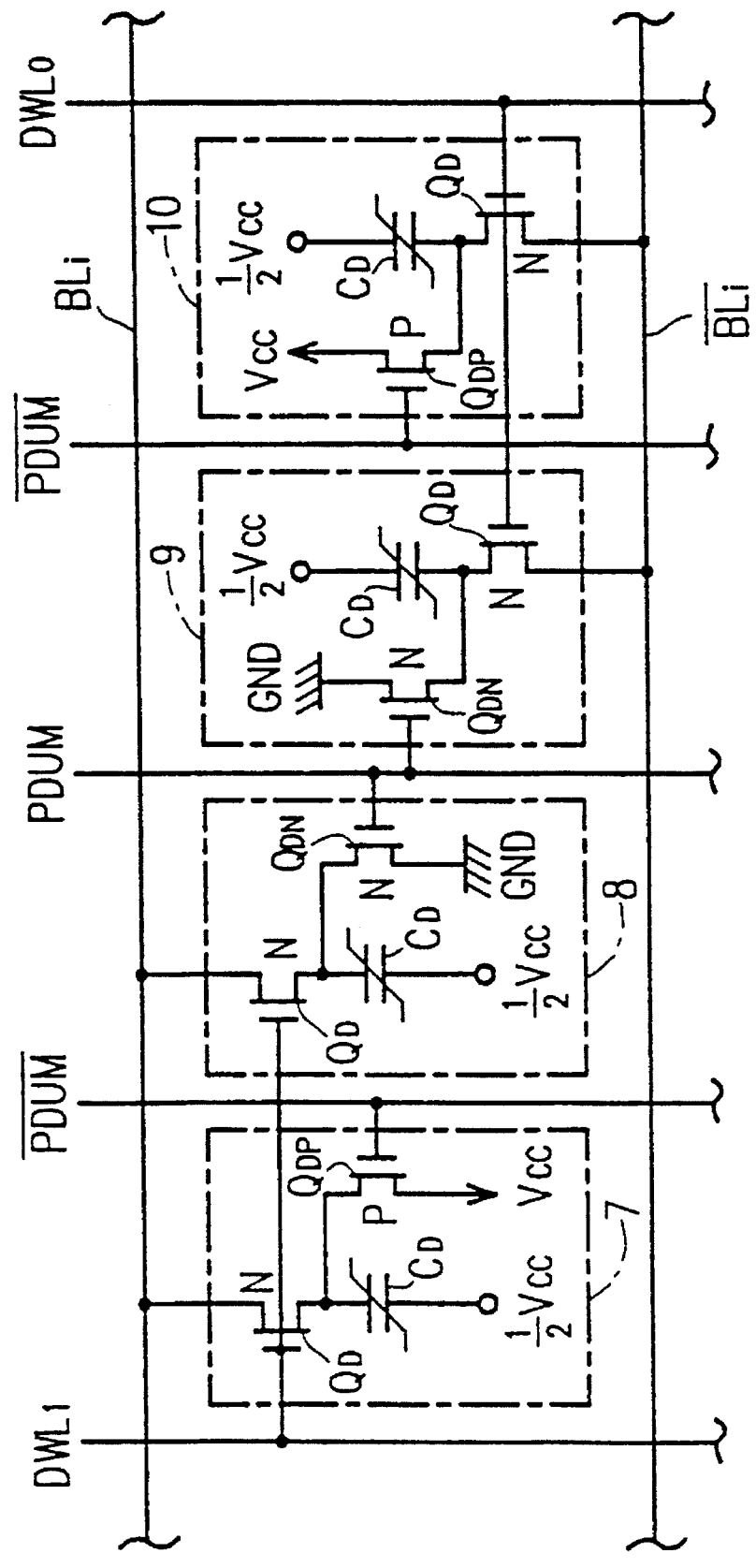
FIG. 12 is a diagram showing the specific circuitry of a dummy cell.
Figure 13:
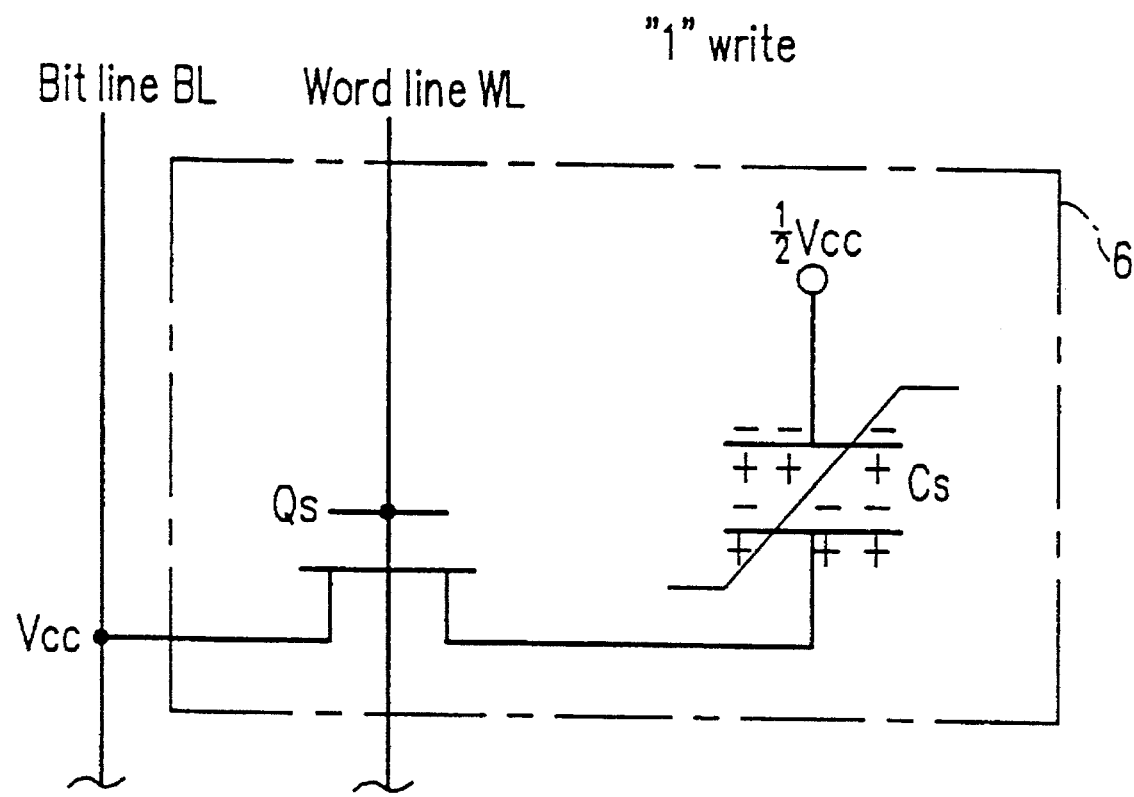
FIG. 13 is a diagram showing a memory cell which retains data "1" in the conventional nonvolatile semiconductor memory device.

As shown in FIG. 12, each of the dummy cells 7–10 includes an N-channel MOSFET $Q_D$ and a dummy capacitor $C_D$ having a ferroelectric film between the electrodes, similar to the memory cell 6. The dummy capacitor $C_D$ is formed so as to have a capacitance which is half of that of the capacitor $C_S$ of the memory cell 6. One of the electrodes of the dummy capacitor $C_D$ is connected to one of the bit lines $BL_i$ and $\overline{BL}_i$ corresponding to the respective dummy cells 7–10, via the source-drain of the transistor $Q_D$. The other electrode of the dummy capacitor $C_D$ is connected to the common cell plate to which a half voltage of the supply voltage $V_{CC}$ is supplied. The gate of the transistor $Q_D$ is connected to respective one of the dummy word lines $DWL_0$ and $DWL_1$ corresponding to the dummy cells 7–10.

In each of the dummy cells 8 and 9, the connection node of one of the electrodes of the dummy capacitor $C_D$ and the source of the transistor $Q_D$ is grounded to the ground potential level GND via an N-channel MOSFET $Q_{DN}$. The gate of the transistor $Q_{DN}$ is connected to a common dummy-cell precharge line PDUM. In each of the dummy cells 8 and 9, when the dummy-cell precharge line PDUM goes high, the ground voltage GND (0 V) is applied to one of the electrodes of the dummy capacitor $C_D$.

In each of the dummy cells 7 and 10, the connection node of one of the electrodes of the dummy capacitor $C_D$ and the source of the transistor $Q_D$ is connected to the $V_{CC}$ power supply via a P-channel MOSFET $Q_{DP}$. The gate of the transistor $Q_{DP}$ is connected to a dummy-cell precharge line $\overline{PDUM}$. In each of the dummy cells 7 and 10, when the dummy-cell precharge line $\overline{PDUM}$ goes low, the supply voltage $V_{CC}$ is applied to one of the electrodes of the dummy capacitor $C_D$.

Figure 2A:
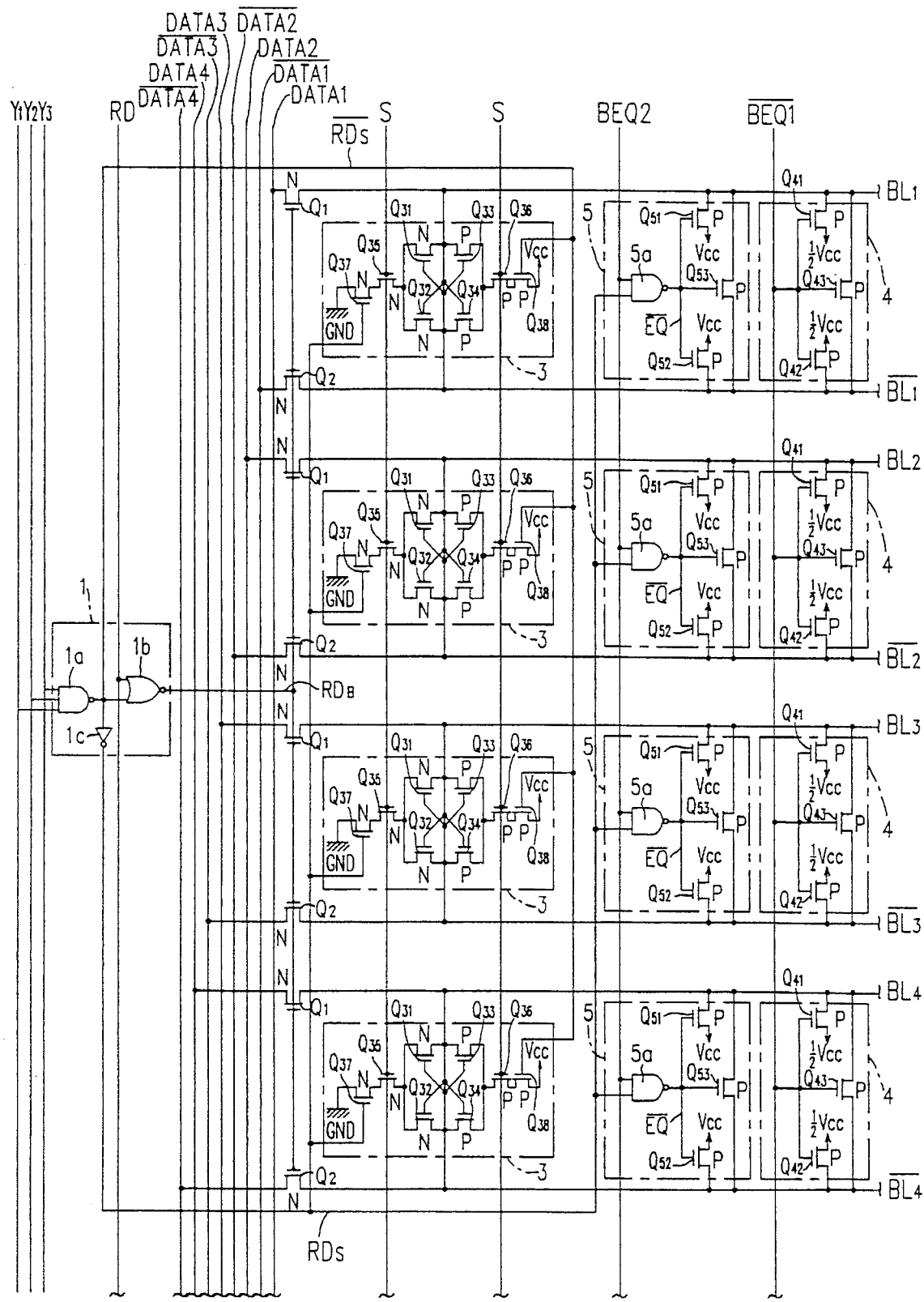
FIG. 2A is a block diagram showing the construction of the sense amplifier and the first and second bit-line precharge circuits shown in FIG. 1 in more detail.
Figure 2B:
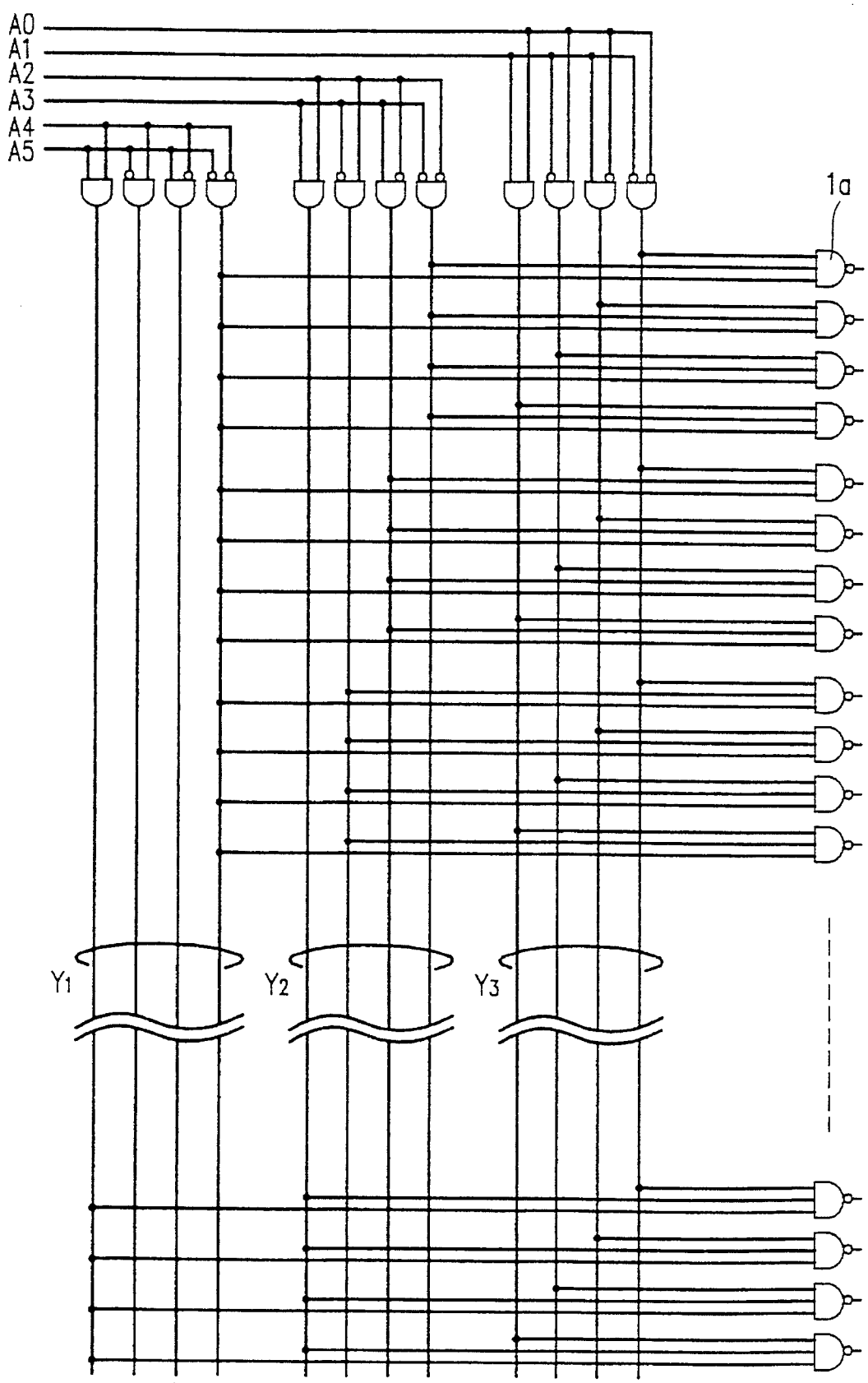
FIG. 2B is a diagram showing the construction of a column-address predecode line in detail.

FIG. 2A shows the circuit configurations of the column decoder 1, the sense amplifier 3, the first bit-line precharge circuit 4, and the second bit-line precharge circuit 5. FIG. 2A shows four pairs of bit lines $BL_i$ and $\overline{BL}_i$ (i=1, 2, 3, and 4).

The bit lines $BL_i$ of the four pairs of bit lines $BL_i$ and $\overline{BL}_i$ are connected to data lines $DATA_i$, respectively, via the source-drain of N-channel MOSFETs $Q_1$. The other bit lines $\overline{BL}_i$ are connected to data lines $\overline{DATA}_i$ via the source-drain of N-channel MOSFETs $Q_2$. Respective data lines $DATA_i$ and $\overline{DATA}_i$ are paired. The gates of the transistors $Q_1$ and $Q_2$ are connected to a bit-line read signal line $RD_B$ from the column decoder 1.

As shown in FIG. 2A, the column decoder 1 includes a 3-input NAND gate 1a, a NOR gate 1b, and an inverter 1c. Three address lines from the column-address predecode lines $Y_1$–$Y_3$ are connected to the three inputs of the 3-input NAND gate 1a. The output of the 3-input NAND gate 1a is connected to a column selection signal line $\overline{RD}_S$. The output of the 3-input NAND gate 1a and the read signal line $\overline{RD}$ are connected to the inputs of the NOR gate 1b. The read signal line $\overline{RD}$ is made low by the operation of a control circuit (not shown) when the sense amplifier 3 finishes the amplification, as described below. The output of the NOR gate 1b is connected to the bit-line read signal line $RD_B$. The output of the 3-input NAND gate 1a is connected to the input of the inverter 1c, and the output of the inverter 1c is connected to the selection signal line $ED_S$. When the three address lines connected to the column decoder 1 are all set high, the column decoder 1 sets the column selection signal line $RD_S$ high, and the column selection signal line $\overline{RD}_S$ low. Thereafter, when the read signal line $\overline{RD}$ goes low, the column decoder 1 sets the bit-line read signal line $RD_B$ high.

The sense amplifier 3 differentially amplifies a small potential difference between bit lines $BL_i$ and $\overline{BL}_i$ by using four transistors $Q_{31}$–$Q_{34}$, so as to make the signal level valid. Among the four transistors, $Q_{31}$ and $Q_{32}$ are N-channel MOSFETs, and $Q_{33}$ and $Q_{34}$ are P-channel MOSFETs. The transistors $Q_{31}$ and $Q_{32}$ are connected to a ground potential level GND via a series circuit of N-channel MOSFETs $Q_{35}$ and $Q_{37}$. The transistors $Q_{33}$ and $Q_{34}$ are connected to a $V_{CC}$ power supply via a series circuit of P-channel MOSFETs $Q_{36}$ and $Q_{38}$. The gate of the transistor $Q_{35}$ is connected to a sense-amplifier driving signal line S. The gate of the transistor $Q_{36}$ is connected to a sense-amplifier driving signal line $\overline{S}$. The gate of the transistor $Q_{37}$ is connected to the selection signal line $RD_S$ from the column decoder 1, and the gate of the transistor $Q_{38}$ is connected to the selection signal line $\overline{RD}_S$.

The sense amplifier 3 performs its differential amplification only when the sense-amplifier driving signal lines S and $\overline{S}$ go high ($V_{CC}$ level) and low (GND level), respectively. In the read operation, after a small potential difference is read out from a memory cell 6 and the dummy cells 7–10 to the bit lines $BL_i$ and $\overline{BL}_i$, the sense-amplifier driving signal lines S and $\overline{S}$ go high and low, respectively by the operation of a control circuit (not shown).

Accordingly, the sense amplifier 3 performs the amplification, only when power is supplied to the sense amplifier 3, under the condition that the selection signal line $RD_S$ and the sense-amplifier driving signal line S go high, and the selection signal line $\overline{RD}_S$ and the sense-amplifier driving signal line $\overline{S}$ go low. When the sense amplifier 3 finishes the amplification, and the bit-line read signal line $RD_B$ from the column decoder 1 goes high, a pair of bit lines $BL_i$ and $\overline{BL}_i$ are connected to the data lines DATA and $\overline{DATA}$ via the transistors $Q_1$ and $Q_2$, respectively. Then, the signal levels which have been made valid on the bit lines $BL_i$ and $\overline{BL}_i$ are output to the data lines DATA and $\overline{DATA}$, respectively.

As shown in FIG. 2A, the first bit-line precharge circuit 4 includes three P-channel MOSFETs $Q_{41}$–$Q_{43}$. The source of the transistor $Q_{41}$ is connected to a ½ $V_{CC}$ power supply which supplies a voltage of half of the supply voltage $V_{CC}$. The drain of the transistor $Q_{41}$ is connected to one bit line $BL_i$. The source of the transistor $Q_{42}$ is connected to the ½ $V_{CC}$ power supply and the drain thereof is connected to the other bit line $\overline{BL}_i$. The drain of the transistor $Q_{43}$ is connected to one bit line $BL_i$, and the source thereof is connected to the other bit line $\overline{BL}_i$. The gates of the transistors $Q_{41}$–$Q_{43}$ are all connected to the first precharge signal line $\overline{BEQ}_1$.

The first precharge signal line $\overline{BEQ}_1$ is temporarily set low by the operation of the control circuit (not shown) immediately before the read operation. When the first precharge signal line $\overline{BEQ}_1$ goes low the bit lines $BL_i$ and $\overline{BL}_i$ are precharged to the voltage half of the supply voltage $V_{CC}$ by the transistors $Q_{41}$ and $Q_{42}$. At the same time, the potentials of the bit lines $BL_i$ and $\overline{BL}_i$ are equalized by the transistor $Q_{43}$.

The second bit-line precharge circuit 5 includes three P-channel MOSFETs $Q_{51}$–$Q_{53}$. The source of the transistor $Q_{51}$ is connected to a $V_{CC}$ power supply which supplies the supply voltage $V_{CC}$. The drain of the transistor $Q_{51}$ is connected to one bit line $BL_i$. The source of the transistor $Q_{52}$ is connected to the $V_{CC}$ power supply and the drain thereof is connected to the other bit line $\overline{BL}_i$. The drain of the transistor $Q_{53}$ is connected to one bit line $BL_i$, and the source thereof is connected to the other bit line $\overline{BL}_i$. The gates of the transistors $Q_{51}$–$Q_{53}$ are all connected to the output of a NAND gate 5a via an equalizing signal line $\overline{EQ}$. A second precharge signal line $BEQ_2$ and the selection signal line $RD_S$ from the column decoder 1 are connected to the input of the NAND gate 5a. The second precharge signal line $BEQ_2$ is temporarily set low by the operation of the control circuit (not shown) after the first precharge signal line $\overline{BEQ}_1$ is temporarily set low.

When the selection signal line $RD_S$ goes high and the second precharge signal line $BEQ_2$ goes high, the equalizing signal line $\overline{EQ}$ goes low. Thus, the bit lines $BL_i$ and $\overline{BL}_i$ are precharged to the supply voltage $V_{CC}$ by the transistors $Q_{51}$ and $Q_{52}$. At the same time the potentials of the bit lines $BL_i$ and $\overline{BL}_i$ are equalized by the transistor $Q_{53}$.

As a result, immediately before the read operation, all of the bit lines BL and $\overline{BL}$ are precharged to the voltage half of the supply voltage $V_{CC}$ by the first bit-line precharge circuit 4, and then only a pair of bit lines BL and $\overline{BL}$ selected by the selection signal line $RD_S$ from the column decoder 1 are precharged again to the supply voltage $V_{CC}$ by the second bit-line precharge circuit 5.

Next, the write operation and the read operation for the memory cells 6 in the nonvolatile semiconductor memory device 100 are described. In the following explanation, a word line WL indicates any one of the word lines $WL_0$–$WL_{n-1}$ selected in the write or read operation. A bit line BL indicates one of a pair of bit lines $BL_i$ and $\overline{BL}_i$ selected at that time, and corresponding to the memory cell 6 connected to the selected word line WL.

The write operation to the memory cell 6 is identical with the conventional case shown in FIGS. 13 through 16.

Figure 14:
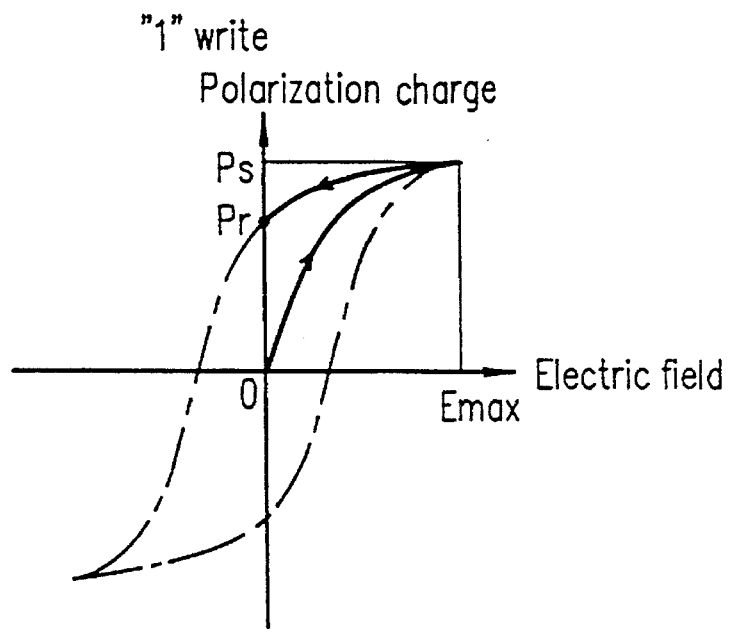
FIG. 14 is a diagram showing the polarization state of a ferroelectric film when the data "1" is retained in the conventional nonvolatile semiconductor memory device.

When data "1" is to be written into the memory cell 6, the word line WL is set high, while a supply voltage $V_{CC}$ is applied to the bit line BL. Accordingly, the transistor $Q_S$ is turned ON, and the supply voltage $V_{CC}$ of the bit line BL is applied to one of the electrodes of the capacitor $C_S$. Since a half voltage of the supply voltage $V_{CC}$ is applied to the other electrode of the capacitor $C_S$, a half voltage of the supply voltage $V_{CC}$ is applied across the electrodes of the capacitor $C_S$ (hereinafter, the polarity of the voltage in this state is assumed to be positive). To the ferroelectric film between the electrodes of the capacitor $C_S$, a positive electric field $E_{max}$ corresponding to a positive half voltage of the supply voltage $V_{CC}$ is applied. Polarization charge $P_s$ is accumulated in the capacitor $C_S$ (FIG. 14).

Thereafter, the word line WL returns to a low level, and the transistor $Q_S$ is turned OFF. Then, due to a leakage current of the ferroelectric film in the capacitor, the potential levels of the two electrodes of the capacitor $C_S$ gradually become equal to each other. At this time, no electric field is applied to the ferroelectric film, but the ferroelectric film holds remanent polarization charge $P_r$. The remanent polarization charge $P_r$ can be held even when the supply of supply voltage to the nonvolatile semiconductor memory device is cut off and ½ $V_{CC}$ is not applied to the other end of the capacitor $C_S$. Therefore, the memory cell 6 stores the data "1" as nonvolatile information by the remanent polarization charge $P_r$.

Figure 15:
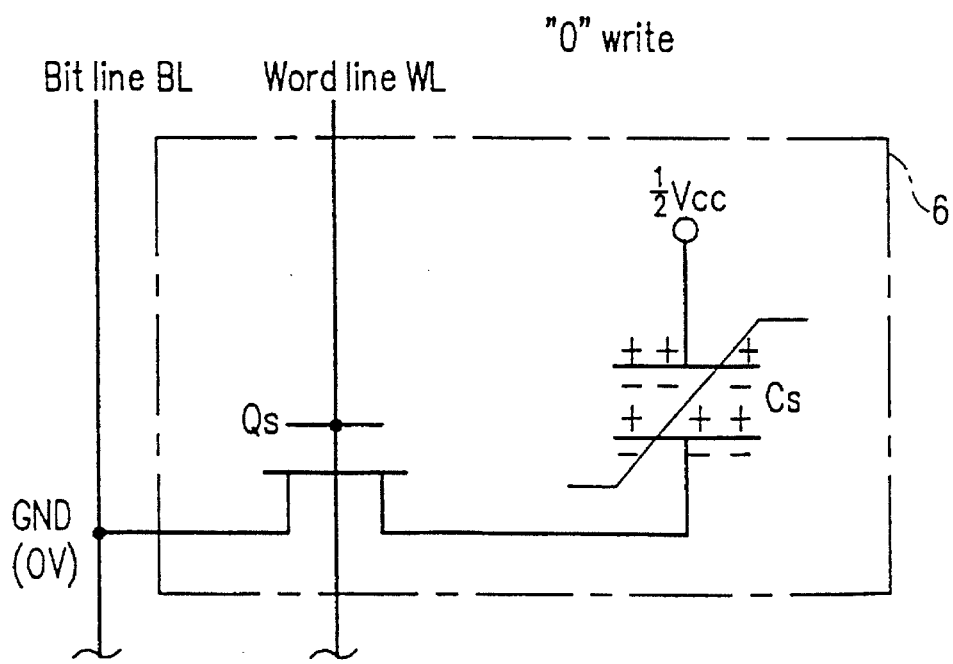
FIG. 15 is a diagram showing a memory cell which retains data "0" in the conventional nonvolatile semiconductor memory device.
Figure 16:
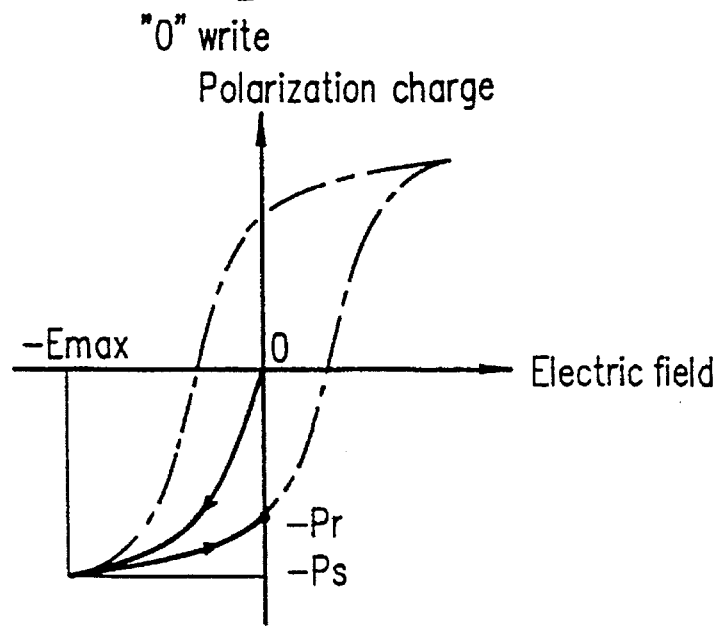
FIG. 16 is a diagram showing the polarization state of a ferroelectric film when the data "0" is retained in the conventional nonvolatile semiconductor memory device.
Figure 17:
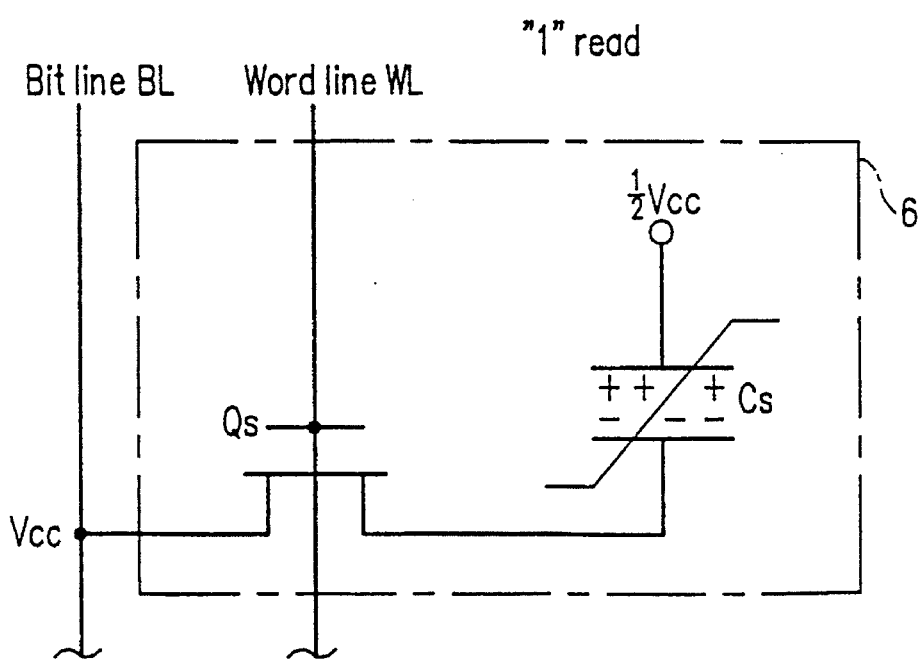
FIG. 17 is a diagram showing a memory cell when the data "1" is read out in the conventional nonvolatile semiconductor memory device.

When data "0" is to be written into the memory cell 6, as shown in FIG. 15, the word line WL is set high, while a ground voltage GND is applied to the bit line BL. Accordingly, the transistor $Q_S$ is turned ON, and 0 V is applied to one of the electrodes of the capacitor $C_S$. A half voltage of the supply voltage $V_{CC}$ of the polarity opposite to that of the above-mentioned case is applied across the electrodes of the capacitor $C_S$ (hereinafter, the polarity of the voltage is assumed to be negative). To the ferroelectric film between the electrodes of the capacitor $C_S$, a negative electric field $-E_{max}$ corresponding to a negative half voltage of the supply voltage $V_{CC}$ is applied. Polarization charge $-P_s$ is accumulated in the capacitor $C_S$ (FIG. 16).

Thereafter, the word line WL returns to a low level, and the transistor $Q_S$ is turned OFF. Then, due to a leakage current of the ferroelectric film in the capacitor, the potential levels of the two electrodes of the capacitor $C_S$ gradually become equal to each other. At this time, no electric field is applied to the ferroelectric film, but the ferroelectric film holds remanent polarization charge $-P_r$. The remanent polarization charge $-P_r$ can be held even when the supply of supply voltage is cut off and ½ $V_{CC}$ is not applied to the other end of the capacitor $C_S$. Therefore, the memory cell 6 stores the data "0" as nonvolatile information by the remanent polarization charge $-P_r$.

Next, the read of data stored in the memory cell 6 will be described. In the read operation for the selected bit lines BL and $\overline{BL}$, prior to the read operation, the first bit-line precharge circuit 4 precharges the bit lines BL and $\overline{BL}$ to a voltage half of the supply voltage $V_{CC}$, and then the second bit-line precharge circuit 5 precharges them again to the supply voltage $V_{CC}$. Thereafter, the read operation is performed in the same way as in the conventional case.

Figure 18:
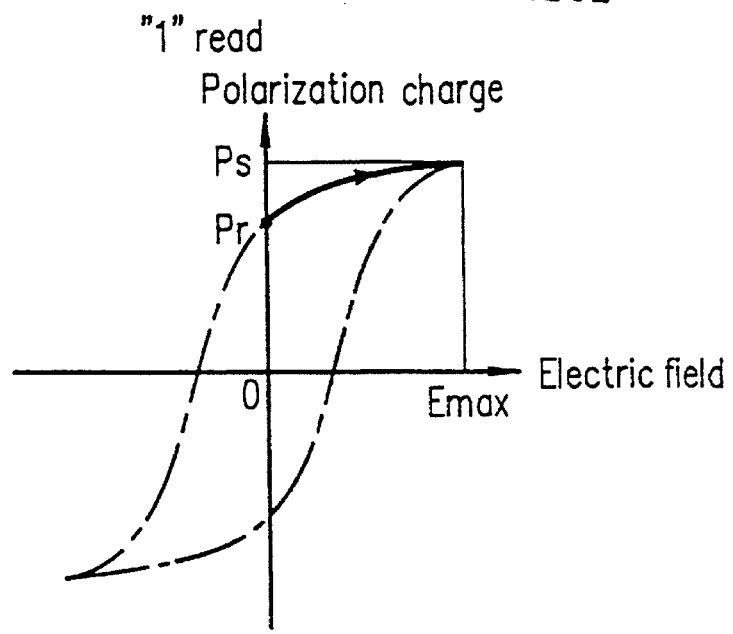
FIG. 18 is a diagram showing the polarization state of the ferroelectric film when the data "1" is read out in the conventional nonvolatile semiconductor memory device.

The read operation when the data "1" is stored in the memory cell 6 is performed in the following way. The word line WL is set high in the precharged state, and then the transistor $Q_S$ is turned ON. Accordingly, the charge of the bit line BL and the remanent polarization charge $P_r$ held in the ferroelectric film of the capacitor $C_S$ are charge-shared. In general, the capacitance $C_B$ of the bit line BL is sufficiently larger than the capacitance $C_S$ of the capacitor $C_S$, so that a voltage substantially equal to the supply voltage $V_{CC}$ is applied to one of the electrodes of the capacitor $C_S$. Therefore, a positive voltage substantially equal to a half of the supply voltage $V_{CC}$ is applied across the electrodes of the capacitor $C_S$, so that, as shown in FIG. 18, an electric field $E_{max}$ corresponding to the positive voltage is applied to the ferroelectric film. Thus, polarization charge $P_s$ is accumulated in the ferroelectric film. As is seen from FIG. 18, a polarization reversal is not caused in the ferroelectric film. The amount of charge moved from the bit line BL to the capacitor $C_S$ is $P_s - P_r$.

Accordingly, the potential variation $\Delta V_1$ of the bit line BL, i.e., the voltage level of the bit line L in the case where the data "1" is read out is given by Equation (1) below.

$$\Delta V_1 = -\frac{P_s - P_r}{C_B} \quad (1)$$

Figure 19:
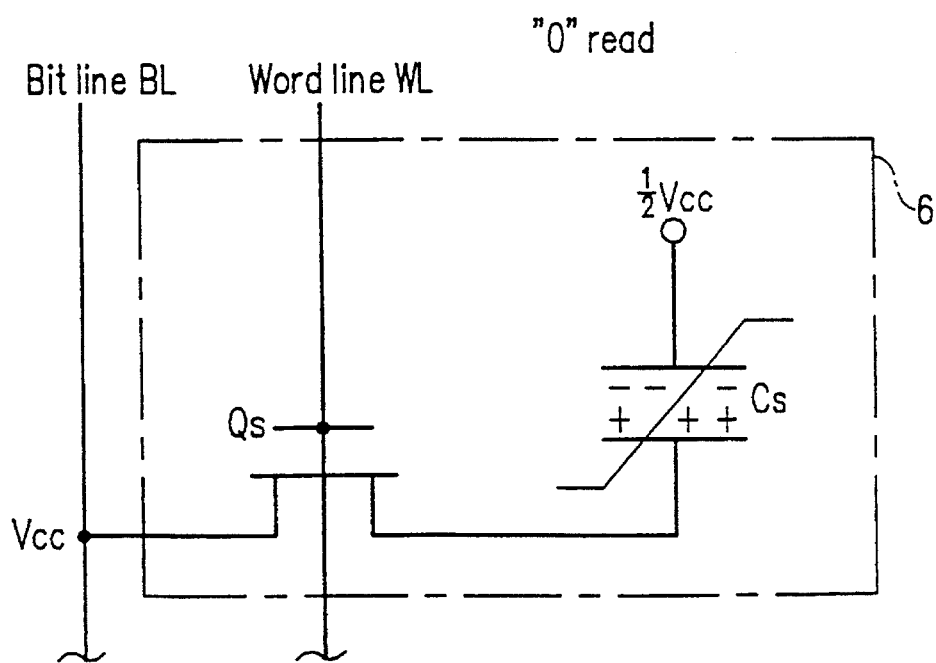
FIG. 19 is a diagram showing a memory cell when the data "0" is read out in the conventional nonvolatile semiconductor memory device.
Figure 20:
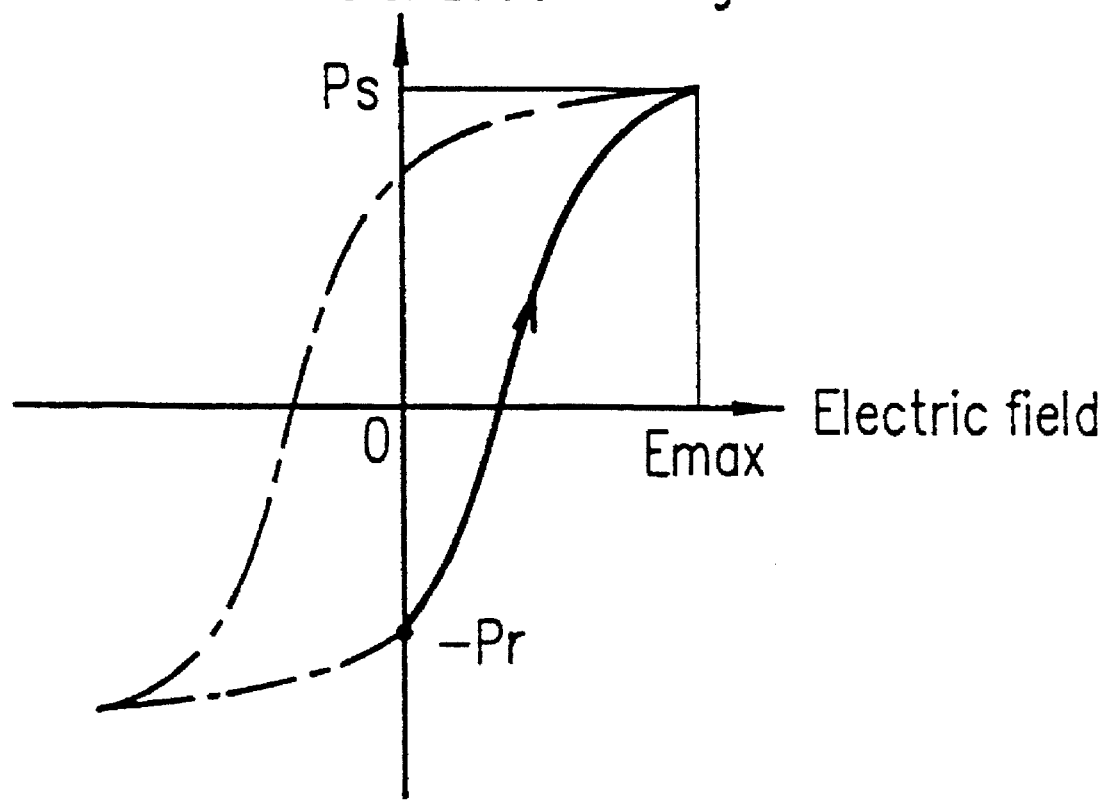
FIG. 20 is a diagram showing the polarization state of the ferroelectric film when the data "0" is read out in the conventional nonvolatile semiconductor memory device.

The read operation when the data "0" is stored in the memory cell 6 is shown in FIG. 19. The word line WL is set high in the state precharged to the supply voltage $V_{CC}$, and then the transistor $Q_S$ is turned ON. Accordingly, the charge of the bit line BL and the remanent polarization charge $-P_r$ held in the ferroelectric film of the capacitor $C_S$ are charge-shared. In general, the capacitance $C_B$ of the bit line BL is sufficiently larger than the capacitance $C_S$ of the capacitor $C_S$, so that a voltage substantially equal to the supply voltage $V_{CC}$ is applied to one of the electrodes of the capacitor $C_S$. Therefore, a positive voltage substantially equal to a half of the supply voltage $V_{CC}$ is applied across the electrodes of the capacitor $C_S$, so that, as shown in FIG. 20, an electric field $E_{max}$ corresponding to the positive voltage is applied to the ferroelectric film. Thus, polarization charge $P_s$ is accumulated in the ferroelectric film. As is seen from FIG. 20, polarization reversal is caused in the ferroelectric film. The amount of charge moved from the bit line BL to the capacitor $C_S$ is $P_s + P_r$.

Accordingly, the potential variation $\Delta V_0$ of the bit line BL, i.e., the voltage level of the bit line L in the case where the data "0" is read out is given by Equation (2) below.

$$\Delta V_0 = -\frac{P_s + P_r}{C_B} \quad (2)$$

As described above, in the read operation, the read voltage (the potential variation of the bit line BL) is different depending on the data stored in the memory cell 6. By detecting and amplifying the difference, it is possible to identify the stored data. In the nonvolatile semiconductor memory device 100, the read voltage (potential variation) of one of a pair of bit lines $BL_i$ and $\overline{BL}_i$ is compared with the potential variation of the other bit line by the dummy cells 7–10, so that the stored data is detected.

For the bit lines $BL_i$ and $\overline{BL}_i$ which are not selected, the second bit-line precharge circuit 5 does not operate Therefore, the non-selected bit lines $BL_i$ and $\overline{BL}_i$ are precharged by the first bit-line precharge circuit 4 prior to the read operation, and kept at the voltage half of the supply voltage $V_{CC}$.

Figure 3:
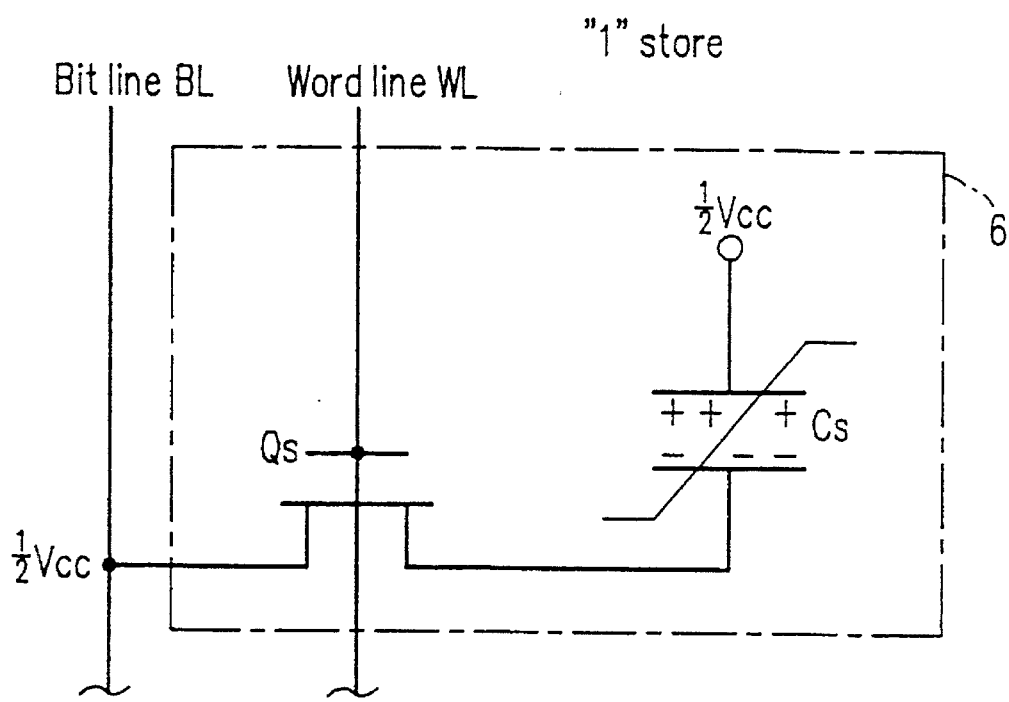
FIG. 3 is a diagram showing a memory cell which retains data "1".
Figure 4:
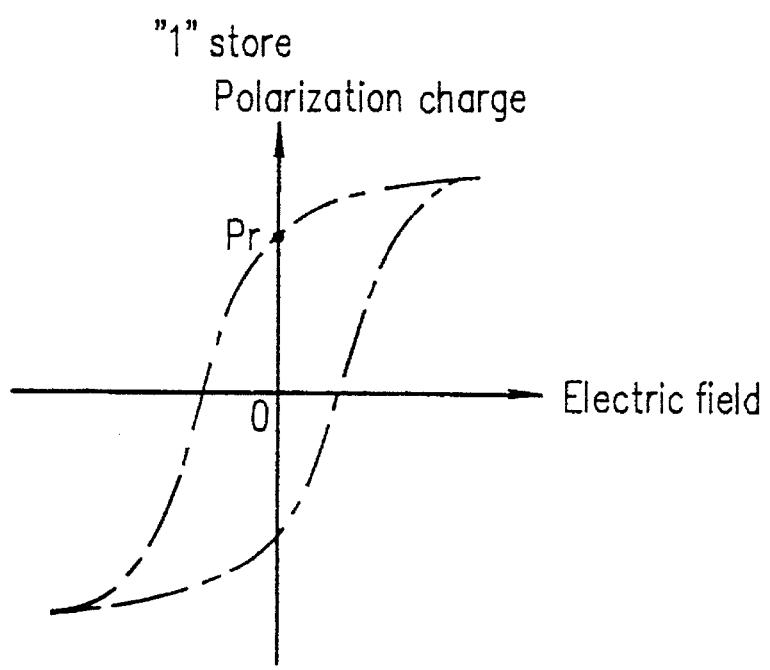
FIG. 4 is a diagram showing the polarization state of a ferroelectric film when the data "1" is retained.

When the memory cell 6 stores the data "1", as shown in FIG. 3, the remanent polarization $P_r$ is held in the ferroelectric film of the capacitor $C_S$. One of the electrodes of the capacitor $C_S$ is connected to the bit line $BL_i$ or $\overline{BL}_i$ via the source-drain of the transistor $Q_S$. The other electrode of the capacitor $C_S$ is connected to a common cell plate for supplying a voltage half of the supply voltage $V_{CC}$. Since the other electrode of the capacitor $C_S$ and the bit line $BL_i$ are both at the voltage of half of the supply voltage $V_{CC}$, no voltage is applied across the electrodes of the capacitor $C_S$ even if the word line $WL_i$ goes high and the transistor $Q_S$ is turned ON in this condition. Therefore, an electric field is not applied to the ferroelectric film, and the remanent polarization charge $P_r$ is still held, so that the data "1" stored in the memory cell 6 is not destroyed but maintained (FIG. 4).

Figure 5:
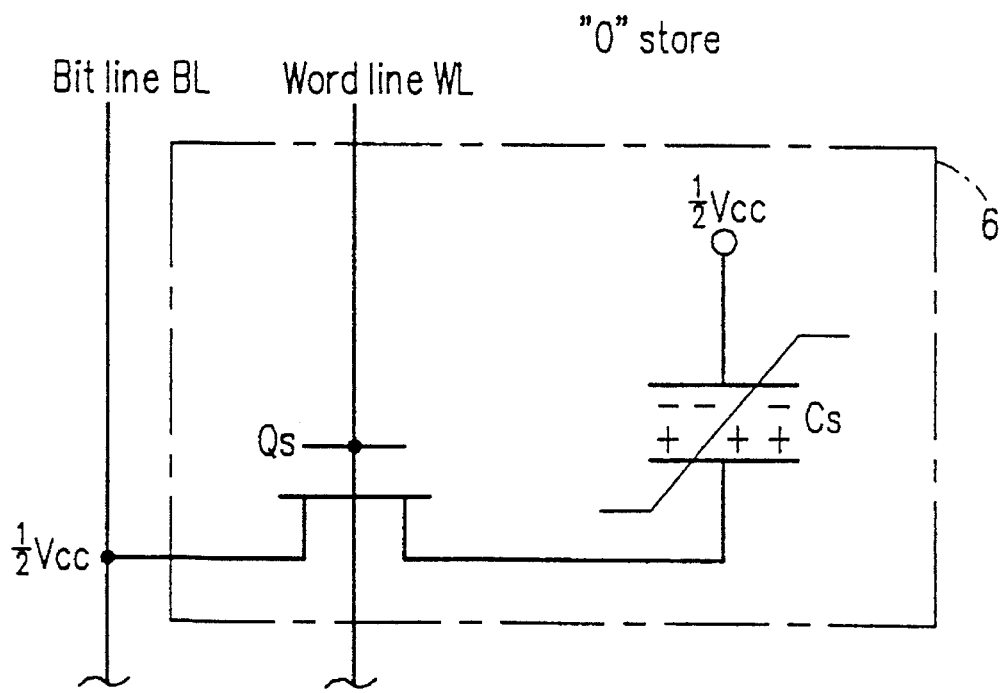
FIG. 5 is a diagram showing a memory cell which retains data "0".
Figure 6:
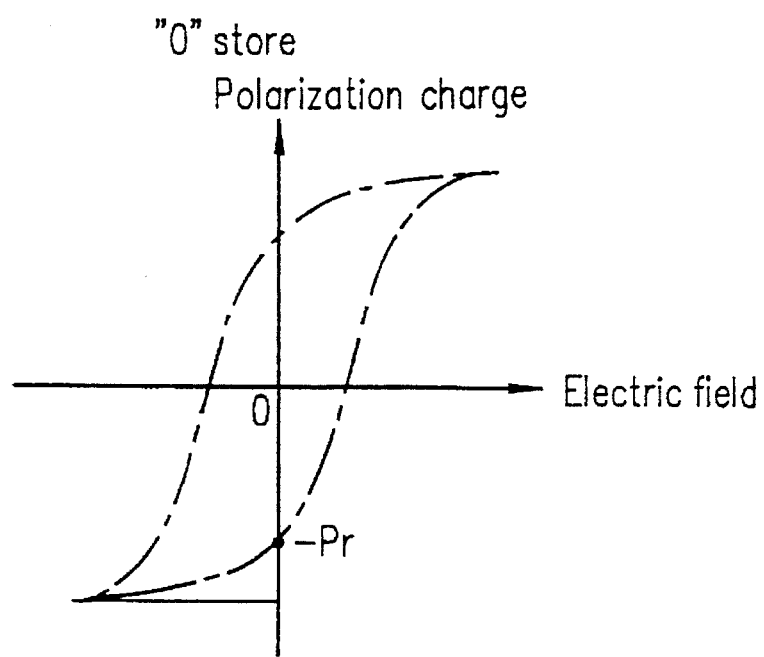
FIG. 6 is a diagram showing the polarization state of a ferroelectric film when the data "0" is etained.

When the memory cell 6 stores the data "0", as shown in FIG. 5, the remanent polarization $-P_r$ of opposite polarity is held in the ferroelectric film of the capacitor $C_S$. As described above, the other electrode of the capacitor $C_S$ and the bit line BL are both at the voltage of half of the supply voltage $V_{CC}$, no voltage is applied across the electrodes of the capacitor $C_S$ even if the word line WL goes high and the transistor $Q_S$ is turned ON in this condition. Therefore, no electric field is applied to the ferroelectric film, and the negative remanent polarization charge $-P_r$ is still held, so that the data "0" stored in the memory cell 6 is not destroyed but maintained. Moreover, in the read operation for either data, the potential of the bit line $BL_i$ is not varied.

Figure 7:
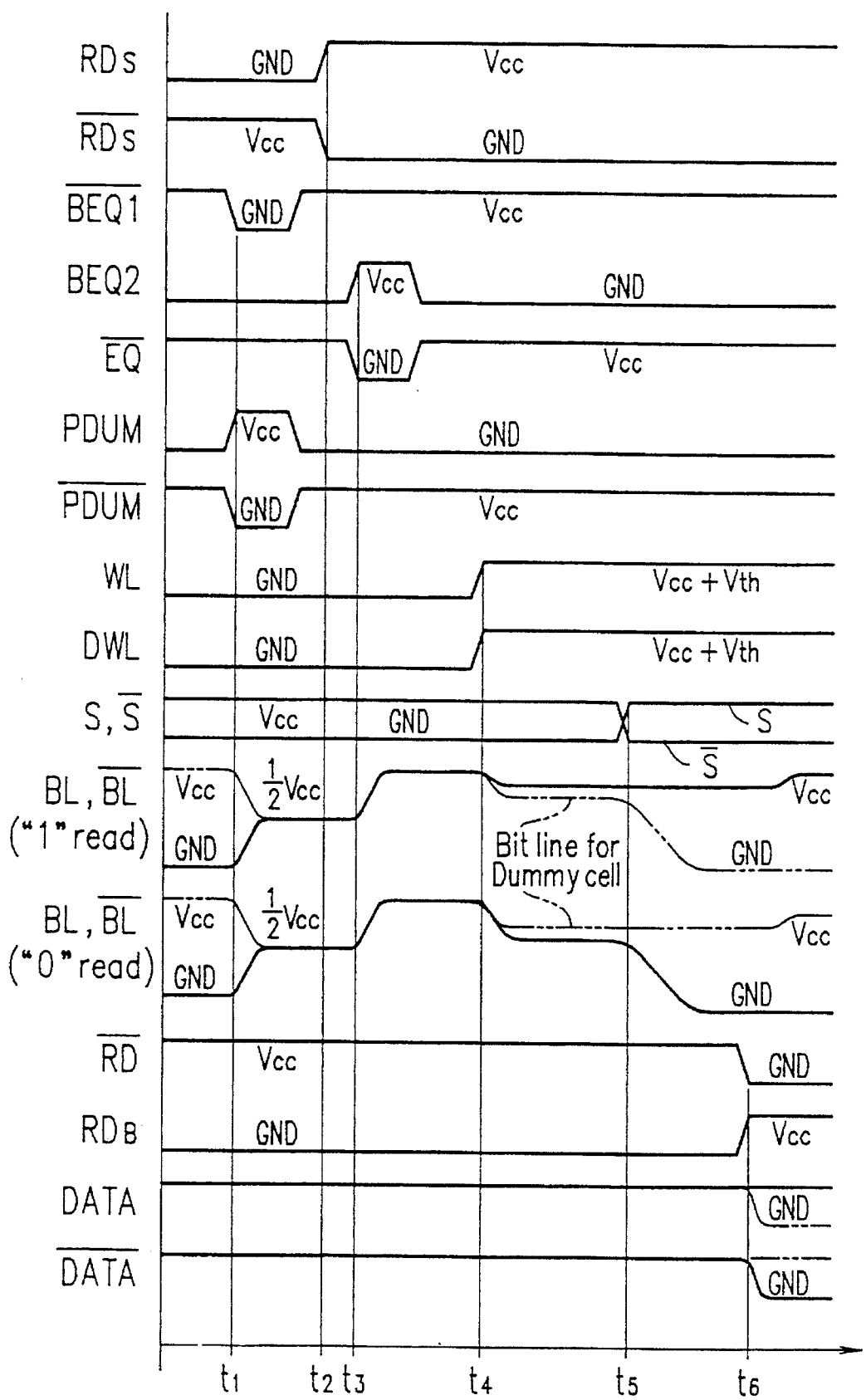
FIG. 7 is a timing diagram showing the read operation of selected bit lines.

Next, by referring to FIGS. 7 and 8, the specific procedure of the read operation in the nonvolatile semiconductor memory device 100 will be described.

The read operation in the selected bit lines BL and $\overline{BL}$ is substantially the same as in the conventional case. That is, as shown in FIG. 7, first, prior to the read operation, at time $t_1$, a low pulse is input into the first precharge signal line $\overline{BEQ}_1$ (i.e., the line is kept at a low level for a predetermined time period), so that the first bit-line precharge circuit 4 is driven. That is, the P-channel transistors $Q_{41}$–$Q_{43}$ are turned ON, and the bit lines BL and $\overline{BL}$ are precharged to the voltage of half of the supply voltage $V_{CC}$. In a synchronizing manner, at the time $t_1$, a high pulse is input into the dummy-cell precharge line PDUM (i.e., the line is kept at a high level for a predetermined time period), so that a ground voltage GND (0 V) is applied to one of the electrodes of the dummy capacitor $C_D$ in each of the dummy cells 8 and 9. Similarly, a low pulse is input into the dummy-cell precharge line $\overline{PDUM}$, so that the supply voltage $V_{CC}$ is applied to one of the electrodes of the dummy capacitor $C_D$ in each of the dummy cells 7 and 10.

When 0 V is applied to one of the electrodes of the dummy capacitor $C_D$, a negative half voltage of the supply voltage $V_{CC}$ is applied across the electrodes of the dummy capacitor $C_D$. Accordingly, similarly to the case where the data "0" is written into the memory cell 6, the ferroelectric film is polarized in a negative direction. When the supply voltage $V_{CC}$ is supplied to one of the electrodes of the dummy capacitor $C_D$, a positive half voltage of the supply voltage $V_{CC}$ is applied across the electrodes of the dummy capacitor $C_D$. Accordingly, similarly to the case where the data "1" is written into the memory cell 6, the ferroelectric film is polarized in a positive direction. Therefore, the ferroelectric films of the dummy capacitors $C_D$ in the two dummy cells (7 and 8, or 9 and 10) connected to the one bit line ($BL_i$ or $\overline{BL}_i$) are polarized in directions opposite to each other. Since the capacitance of the capacitor $C_D$ in each of the dummy cells 7–10 is half of the capacitance of the capacitor $C_S$ in the memory cell 6, the charge held in the dummy capacitor $C_D$ is half of the charge held in the capacitor $C_S$.

When a pair of bit lines BL and $\overline{BL}$ are selected by the column decoder 1, the column selection signal line $RD_S$ rises to the high level, and the column selection signal line $\overline{RD}_S$ falls to the low level (at time $t_2$). Then, when a high pulse is input to the second precharge signal line $BEQ_2$, since the column selection signal line $RD_S$ is at the high level, the equalizing signal line $\overline{EQ}$ goes low (at time $t_3$), so that the second bit-line precharge circuit 5 is driven. That is, the P-channel transistors $Q_{51}$, $Q_{52}$, and $Q_{53}$ are turned ON, and the selected bit-line pair BL and $\overline{BL}$ are precharged again to the supply voltage $V_{CC}$ which is different from the potential $V_{CC}/2$ of the common cell plate (one of the electrodes of the capacitor).

Figure 21:
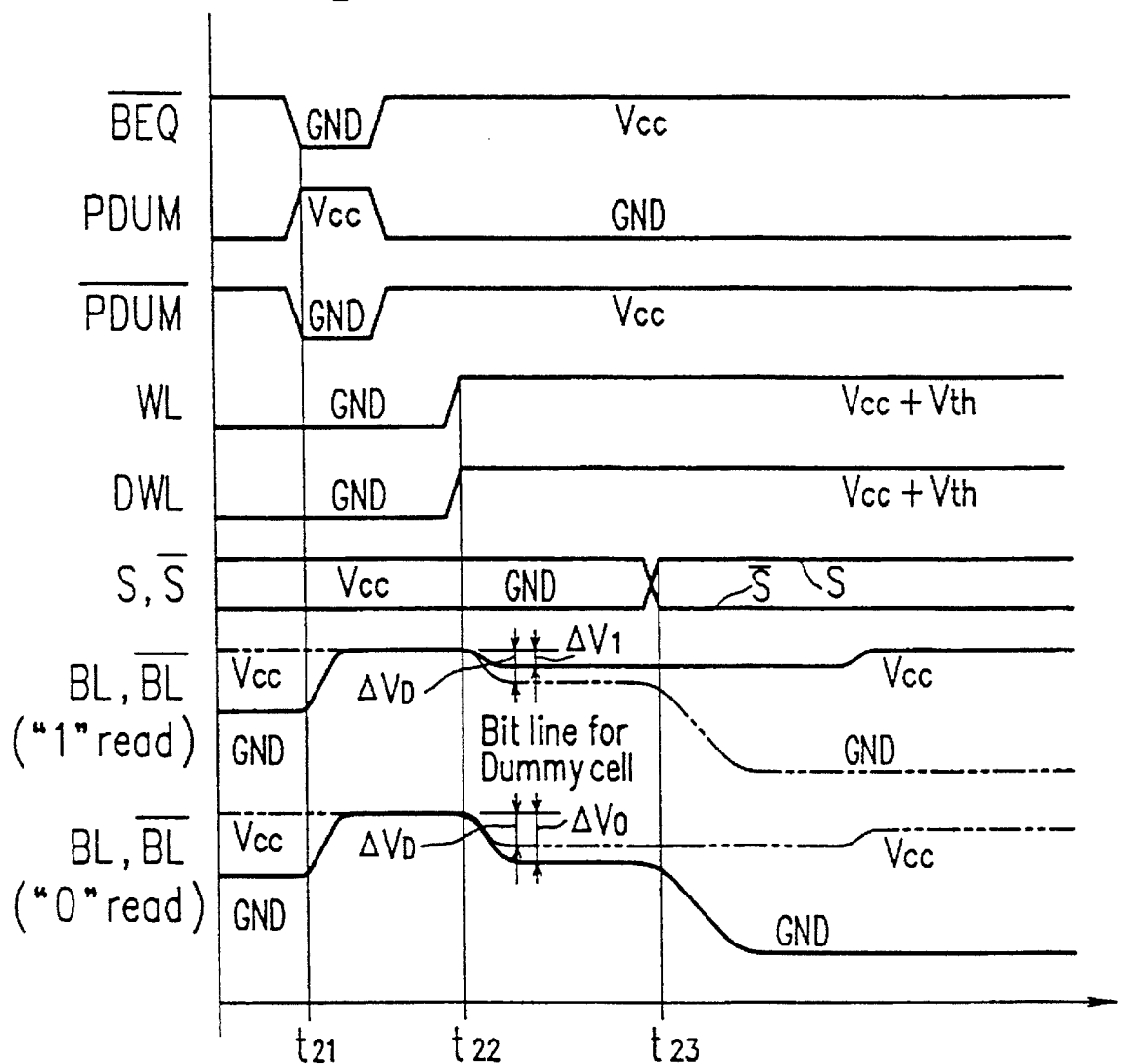
FIG. 21 is a timing diagram showing the read operation in the conventional nonvolatile semiconductor memory device.
Figure 22:
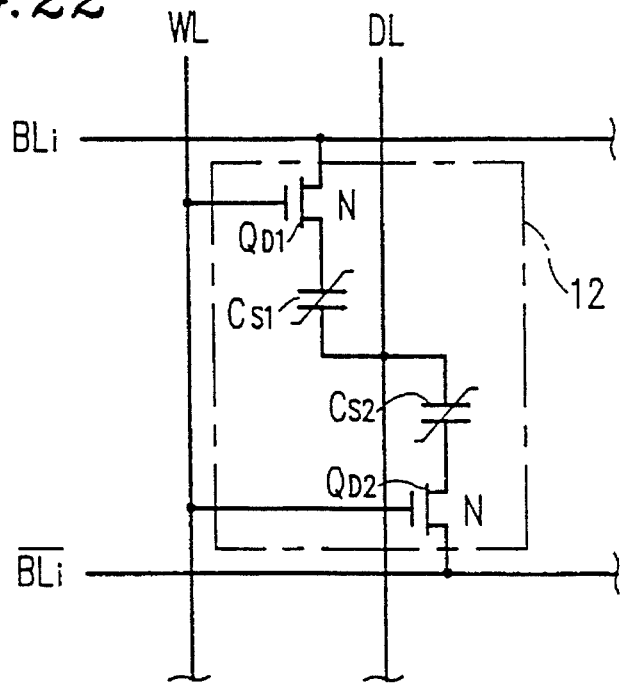
FIG. 22 is a circuit diagram showing a conventional memory cell.
Figure 23:
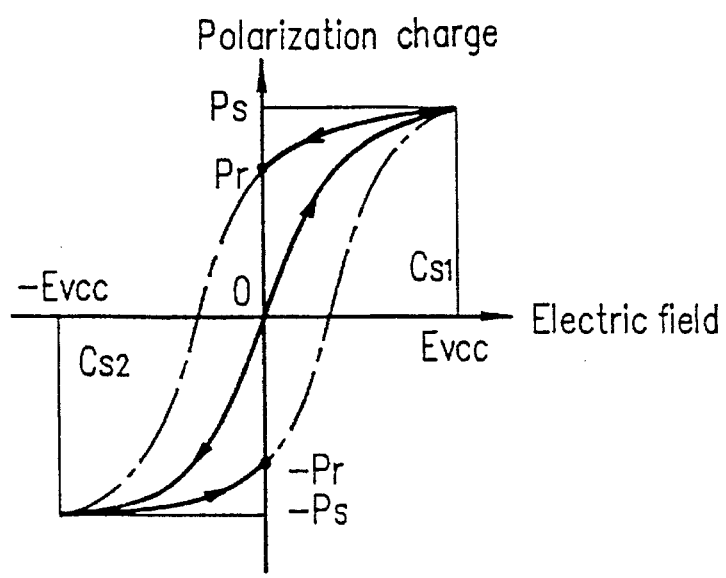
FIG. 23 is a diagram showing the polarization state of the ferroelectric film when the data "1" is written in another conventional example.
Figure 24:
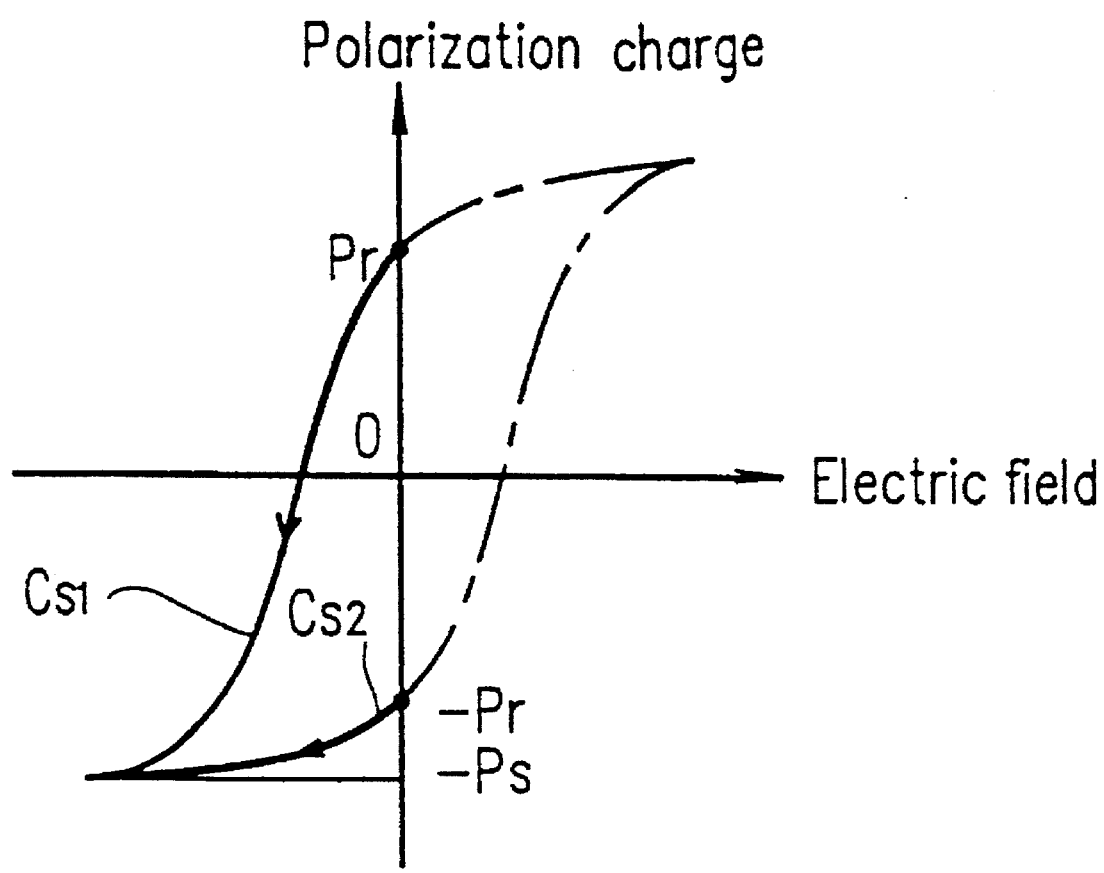
FIG. 24 is a diagram showing the polarization state of the ferroelectric when the data "1" is written in still another conventional example.

This state is the same as that immediately before time $t_{22}$ in the above-described read operation (FIG. 21). Therefore, the read operation thereafter is the same as that in the above-described case. First, at time $t_4$ at which the read operation starts, any one word line WL of the word lines $WL_0$–$WL_{n-1}$ is selected to be set high, and the transistor $Q_S$ of the memory cell 6 connected to the word line WL is turned ON. When data "1" is stored in the memory cell 6, as described above, the charge corresponding to $(P_s - P_r')$ moves from the bit line BL to the capacitor $C_S$. As a result, the potential of the bit line BL is lowered from the supply voltage $V_{CC}$ by the potential variation $\Delta V_1$ expressed by Equation (1). When data "0" is stored in the memory cell 6, as described above, the charge corresponding to $(P_s + P_r)$ moves so that the potential of the bit line BL which is connected to the memory cell 6 is lowered from the supply voltage $V_{CC}$ by the potential variation $\Delta V_0$ expressed by Equation (2).

At time $t_4$, any one dummy word line DWL corresponding to the selected word line WL is also set high, so that the respective transistors $Q_D$ of the dummy-cell pair 7 and 8 or 9 and 10 are turned ON. As described above, the total amount of charge moving from the bit line BL to the pair of dummy cells 7 and 8 or 9 and 10 is $P_s$ in any case, On the bit line BL, either one of potential differences having opposite polarities and the same absolute values occurs depending on the data stored in the memory cell 6 is "1" or "0".

At time $t_5$, the sense-amplifier driving signal lines S and $\overline{S}$ go high and low, respectively. Since the column selection signals $RD_S$ and $\overline{RD}_S$ have been set high and low, respectively, the sense amplifier 3 is driven so as to differentially amplify the potential difference. Then, the potentials of the pair of bit lines BL and $\overline{BL}$ are changed to the supply voltage $V_{CC}$ and the ground voltage GND, respectively, depending on the polarity of the potential difference, so as to make the signal level valid.

After the amplification of the sense amplifier 3 is finished, at time $t_6$, the read signal line $\overline{BD}$ falls to the low level. At this time, the output of the NAND circuit 1a of the column decoder 1 is at a low level, so that the bit-line read signal line $RD_B$ rises to the high level, and hence the transistors $Q_1$ and $Q_2$ are turned ON. The pair of bit lines BL and $\overline{BL}$ are connected to the data lines DATA and $\overline{DATA}$ via the transistors $Q_1$ and $Q_2$, respectively. Thus, the signal level of the data which is read out from the memory cell 6 and made valid is output.

Next, the read operation in the non-selected bit-line pair $BL_i$ and $\overline{BL}_i$ will be described.

Figure 8:
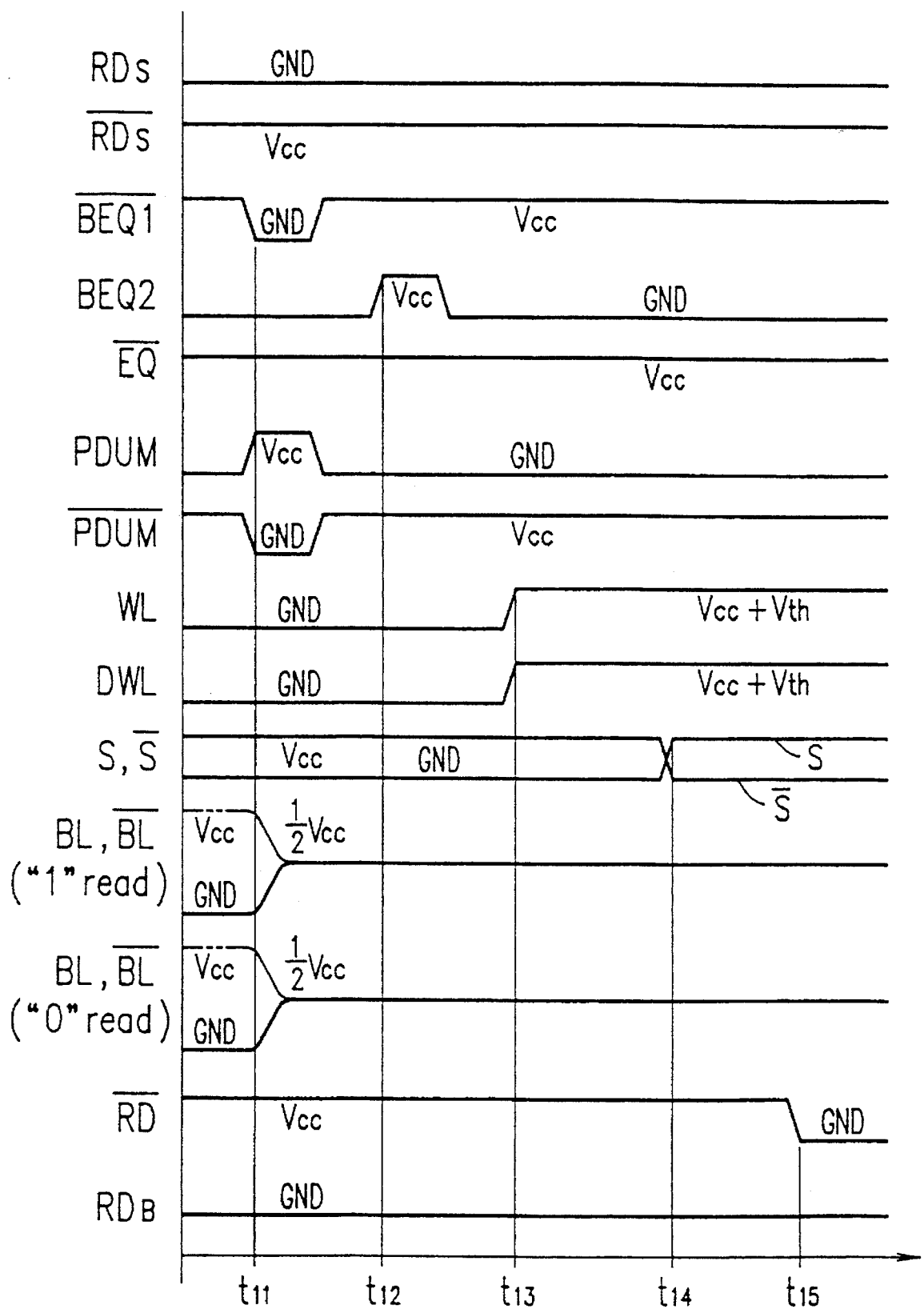
FIG. 8 is a timing diagram showing the read operation of non-selected bit lines.
Figure 9:
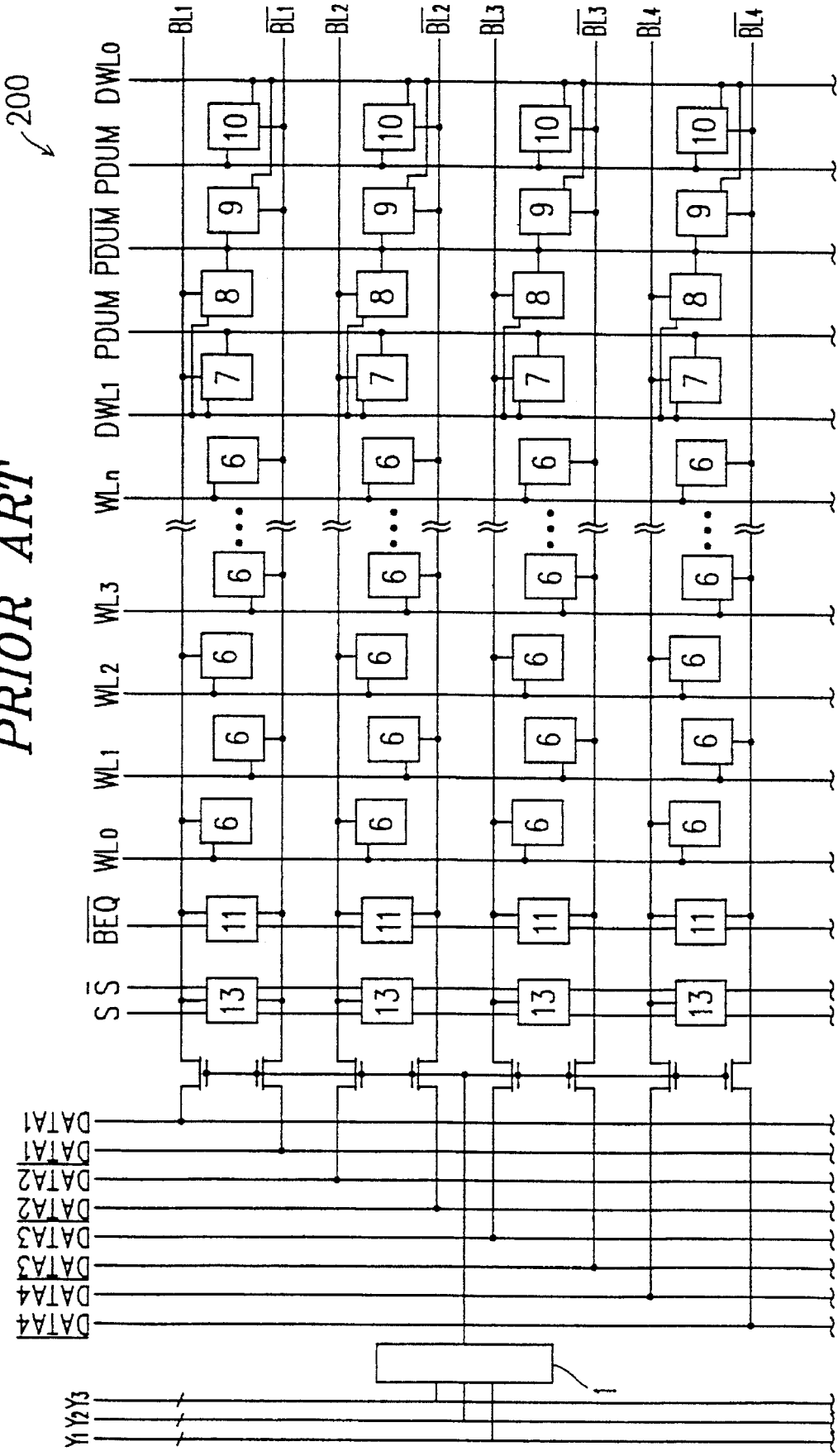
FIG. 9 is a block diagram showing a part of the circuitry of a conventional nonvolatile semiconductor memory device.
Figure 10:
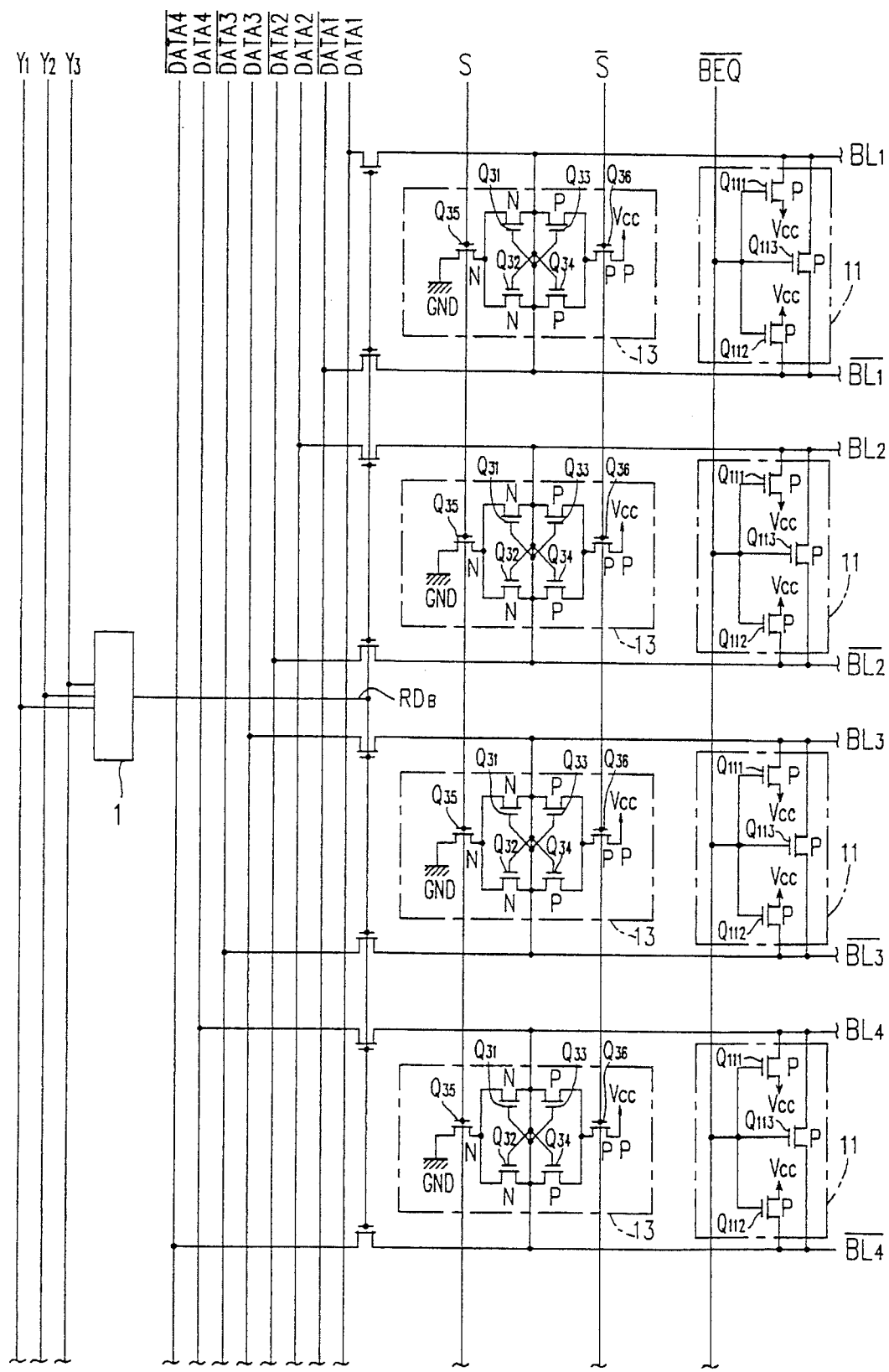
FIG. 10 is a block diagram showing the sense amplifier and the bit-line equalizing circuit shown in FIG. 9 in more detail.

As shown in FIG. 8, first, prior to the read operation, at time $t_{11}$, a low pulse is input to the first precharge signal line $\overline{BEQ}_1$, so that the first bit-line precharge circuit 4 is driven. Thus, the bit lines BL and $\overline{BL}$ are precharged to the voltage half of the supply voltage $V_{CC}$. In a synchronizing manner, at the time $t_{11}$, a high pulse is input into the dummy-cell precharge line PDUM, so that a ground voltage GND (0 V) is applied to one of the electrodes of the dummy capacitor $C_D$ in each of the dummy cells 8 and 9. Similarly, a low pulse is input into the dummy-cell precharge line $\overline{PDUM}$, so that the supply voltage $V_{CC}$ is applied to one of the electrodes of the dummy capacitor $C_D$ in each of the dummy cells 7 and 10. In the same way as described above, the ferroelectric films of the dummy capacitors $C_D$ in a pair of dummy cells (7 and 8, or 9 and 10) are polarized in directions opposite to each other.

Next, at time $t_{12}$, the second precharge signal line $BEQ_2$ goes high. In the case of the non-selected bit-line pair $BL_i$ and $\overline{BL}_i$, the column decoder 1 is not selected. Thus, the column selection signals $RD_S$ and $\overline{RD}_S$ are kept at the low level and the high level, respectively. Since the column selection signals $RD_S$ and $\overline{RD}_S$ are kept inactive, the second bit-line precharge circuit 5 is not driven. Therefore, the bit-line pair $BL_i$ and $\overline{BL}_i$ is kept in the condition precharged at the voltage half of the supply voltage $V_{CC}$.

At time $t_{13}$, any one word line WL is selected to be set high, and the transistor $Q_S$ of the memory cell 6 connected to the word line WL is turned ON. Since in the memory cells 6 connected to the non-selected bit lines, the potential of the bit line to be precharged at $\frac{1}{2} V_{CC}$ is equal to the potential of one electrode of the capacitor $C_S$ (the common cell plate), no voltage is applied to the ferroelectric film of the capacitor $C_S$ (see FIGS. 3–6). Therefore, the data stored in the memory cells 6 are safely retained.

At time $t_{13}$, any one dummy word line DWL is also set high, so that the respective transistors $Q_D$ of the dummy-cell pair 7 and 8 or 9 and 10 are turned ON. Similarly to the case of the above-described memory cells, in the dummy cells connected to the non-selected bit lines, the remanent polarization charges of the capacitors $Q_D$ are kept retained.

Thereafter, at time $t_{14}$, the sense-amplifier driving signal lines S and $\overline{S}$ go high and low, respectively. Since the column selection signals $RD_S$ and $\overline{RD}_S$ have been set low and high, respectively, i.e., inactive, the sense amplifier 3 is not driven. Accordingly the bit line $BL_i$ (or $\overline{BL}_i$) connected to the memory cells 6 is kept at $\frac{1}{2} V_{CC}$, so that the polarization charges held in the capacitors $C_S$ of the memory cells 6 are kept retained. In addition, waste power consumption can be prevented by avoiding meaningless amplification for bit lines $BL_i$ and $\overline{BL}_i$ which cause no potential difference.

Then, at time $t_{15}$, the read signal line $\overline{RD}$ falls to the low level. At this time, the output of the NAND circuit 1a of the column decoder 1 is at a high level, so that the bit-line read signal line $RD_B$ is still at the low level and inactive (the transistors $Q_1$ and $Q_2$ are in the OFF state). The pair of bit lines $BL_i$ and $\overline{BL}_i$ are not connected to the data lines DATA and $\overline{DATA}$. Thus the bit line $BL_i$ (or $\overline{BL}_i$) connected to the memory cells 6 are kept at $\frac{1}{2} V_{CC}$, so that the polarization charges held in the capacitors $C_S$ of the memory cells 6 can be kept retained.

As described above, according to the nonvolatile semiconductor memory device 100 of the invention, the potential of the non-selected bit line $BL_i$ is precharged to $\frac{1}{2} V_{CC}$ which is equal to that of the common cell plate connected to the other electrode of the capacitor $C_S$ of the memory cell 6. Accordingly, even if the transistor $Q_S$ of the memory cell 6 is turned ON when the word line WL is selected, no voltage is applied to the capacitor $C_S$ and the polarization charge held in the ferroelectric film is kept retained. Due to such construction, for the memory cells connected to the non-selected bit line, it is unnecessary to perform the rewriting after the read operation. In addition, the sense amplifiers 3 connected to the non-selected bit line $BL_i$ do not operate, so that the power consumption can be remarkably reduced.

In this example, the nonvolatile semiconductor memory device having memory cells of 1C-1Tr type has been described. Alternatively, the invention can be applied to a nonvolatile semiconductor memory device having memory cells of 2C-2Tr type.

As apparent from the above description, according to the nonvolatile semiconductor memory device of the invention, the data of memory cells corresponding to non-selected bit lines are not destroyed during the read operation. Therefore, it is not necessary to perform the rewriting after the data read for most bit lines which are not selected, so that the power consumption of the nonvolatile semiconductor memory device can be greatly reduced.

Moreover, the sense amplifiers connected to the non-selected bit lines, so that waste power consumption can be positively reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nonvolatile semiconductor memory device comprising:

a plurality of bit-line pairs;

a plurality of word lines;

a plurality of memory cells each including a capacitor having a ferroelectric film between electrodes thereof and a switching element connected to one of the word lines, one of the electrodes of the capacitor being connected to one bit line of the bit-line pairs via the switching element, the other electrode of the capacitor being connected to a common cell plate;

a plurality of sense amplifiers each connected to one of the bit-line pairs;

a row decoder for selecting one of the word lines corresponding to an input row address; and a column decoder for selecting at least one of the bit-line pairs corresponding to an input column address, the device further comprising:

first driving means for precharging the plurality of bit lines to a first potential; and second driving means for precharging again the bit-line pair selected by the column decoder to a second potential which is different from the first potential, wherein a potential difference between the first potential and a potential of the common cell plate is smaller than a potential difference which causes polarization reversal in the ferroelectric film, and a potential difference between the second potential and the potential of the common cell plate is equal to or larger than the potential difference which causes polarization reversal in the ferroelectric film.

2. A nonvolatile semiconductor memory device according to claim 1, further comprising selection means for selecting among the sense amplifiers, a sense amplifier connected to the at least one bit-line pair selected by the column decoder, and for activating the selected sense amplifier.

3. A nonvolatile semiconductor memory device according to claim 1, wherein the first potential is substantially equal to the potential of the common cell plate.

4. A nonvolatile semiconductor memory device according to claim 3, wherein the second potential is a supply voltage, and the first potential is a half of the supply voltage.

5. A nonvolatile semiconductor memory device according to claim 1, wherein the second driving means includes a NAND gate having inputs which are coupled to a precharge signal line and a column selection signal line.

6. A method for driving a nonvolatile semiconductor memory device comprising: a plurality of bit-line pairs; a plurality of word lines; and a plurality of memory cells for storing data, each including a capacitor having a ferroelectric film between electrodes thereof and a switching element connected to one of the word lines, one of the electrodes of the capacitor being connected to one bit line of the bit-line pairs via the switching element, the other electrode of the capacitor being connected to a common cell plate, the method comprising the steps of:

precharging the plurality of bit-line pairs to a first potential;

selecting at least one of the bit-line pairs corresponding to an input column address;

precharging again the selected bit-line pair to a second potential which is different from the first potential;

selecting one of the word lines corresponding to an input row address;

reading out data stored in memory cells connected to the selected bit lines among the memory cells connected to the selected word lines, onto the selected bit lines; and amplifying the data read out onto the bit lines, so as to make the data valid, wherein a potential difference between the first potential and a potential of the common cell plate is smaller than a potential difference which causes polarization reversal in the ferroelectric film, whereby data stored in memory cells connected to non-selected bit lines are retained without being destroyed.

7. A driving method according to claim 6, wherein a potential difference between the second potential and the potential of the common cell plate is equal to or larger than the potential difference which causes polarization reversal in the ferroelectric film.

8. A driving method according to claim 6, wherein the step of amplifying and validating the data is selectively performed for the selected bit-line pair.

9. A driving method according to claim 6, wherein the first potential is substantially equal to the potential of the common cell plate.

10. A driving method according to claim 9, wherein the second potential is a supply voltage and the first potential is half of the supply voltage.

* * * * *